(12) United States Patent
Hung et al.

(10) Patent No.: US 11,715,738 B2
(45) Date of Patent: Aug. 1, 2023

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Tsung-Yu Hung, Hsinchu (TW); Pei-Wei Lee, Pingtung County (TW); Pang-Yen Tsai, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/875,034

(22) Filed: Jul. 27, 2022

(65) Prior Publication Data

US 2022/0367525 A1 Nov. 17, 2022

Related U.S. Application Data

(63) Continuation of application No. 17/119,539, filed on Dec. 11, 2020, now Pat. No. 11,417,684, which is a continuation of application No. 16/351,831, filed on Mar. 13, 2019, now Pat. No. 10,872,906.

(60) Provisional application No. 62/750,776, filed on Oct. 25, 2018.

(51) Int. Cl.
| | |
|---|---|
| *H01L 27/12* | (2006.01) |
| *H01L 27/092* | (2006.01) |
| *H01L 29/06* | (2006.01) |
| *H01L 29/161* | (2006.01) |
| *H01L 21/8238* | (2006.01) |
| *H01L 21/84* | (2006.01) |
| *H01L 21/02* | (2006.01) |
| *H01L 29/10* | (2006.01) |

(52) U.S. Cl.
CPC ...... *H01L 27/1207* (2013.01); *H01L 21/0262* (2013.01); *H01L 21/02532* (2013.01); *H01L 21/823807* (2013.01); *H01L 21/823821* (2013.01); *H01L 21/845* (2013.01); *H01L 27/0924* (2013.01); *H01L 27/1211* (2013.01); *H01L 29/0649* (2013.01); *H01L 29/1054* (2013.01); *H01L 29/161* (2013.01)

(58) Field of Classification Search
CPC combination set(s) only.
See application file for complete search history.

(56) References Cited

U.S. PATENT DOCUMENTS

| | | | |
|---|---|---|---|
| 9,093,530 B2 | 7/2015 | Huang et al. | |
| 9,105,490 B2 | 8/2015 | Wang et al. | |
| 9,171,929 B2 | 10/2015 | Lee et al. | |
| 9,214,555 B2 | 12/2015 | Oxland | |
| 9,236,267 B2 | 1/2016 | De et al. | |
| 9,236,300 B2 | 1/2016 | Liaw | |

(Continued)

*Primary Examiner* — Niki H Nguyen
(74) *Attorney, Agent, or Firm* — Birch, Stewart, Kolasch & Birch, LLP

(57) ABSTRACT

A semiconductor device includes a substrate, a first semiconductor fin and a gate stack. The first semiconductor fin is over the substrate and includes a first germanium-containing layer and a second germanium-containing layer over the first germanium-containing layer. The first germanium-containing layer has a germanium atomic percentage higher than a germanium atomic percentage of the second germanium-containing layer. The gate stack is across the first semiconductor fin.

20 Claims, 36 Drawing Sheets

(56) References Cited

U.S. PATENT DOCUMENTS

| | | |
|---|---|---|
| 9,406,804 B2 | 8/2016 | Huang et al. |
| 9,443,769 B2 | 9/2016 | Wang et al. |
| 9,520,482 B1 | 12/2016 | Chang et al. |
| 9,548,303 B2 | 1/2017 | Lee et al. |
| 9,548,366 B1 | 1/2017 | Ho et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,831,183 B2 | 11/2017 | Lin et al. |
| 9,859,386 B2 | 1/2018 | Ho et al. |
| 10,872,906 B2 * | 12/2020 | Hung .................. H01L 29/0649 |
| 2016/0027918 A1 * | 1/2016 | Kim .................... H01L 29/7848 |
| | | 257/401 |

* cited by examiner ated 90
SEMICONDUCTOR DEVICE AND MANUFACTURING METHOD THEREOF This application is a Continuation Application of U.S. application Ser. No. 17/119,539, filed Dec. 11, 2020, which is a Continuation Application of U.S. application Ser. No. 16/351,831, filed Mar. 13, 2019, now U.S. Pat. No. 10,872,906, issued on Dec. 22, 2020, which claims priority to U.S. Provisional Patent Application Ser. No. 62/750,776, filed Oct. 25, 2018, all of which are herein incorporated by reference in their entireties.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides.

However, there are challenges to implementation of suitable channel materials on a single substrate and processes in complementary metal-oxide-semiconductor (CMOS) fabrication, thereby degrading the device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
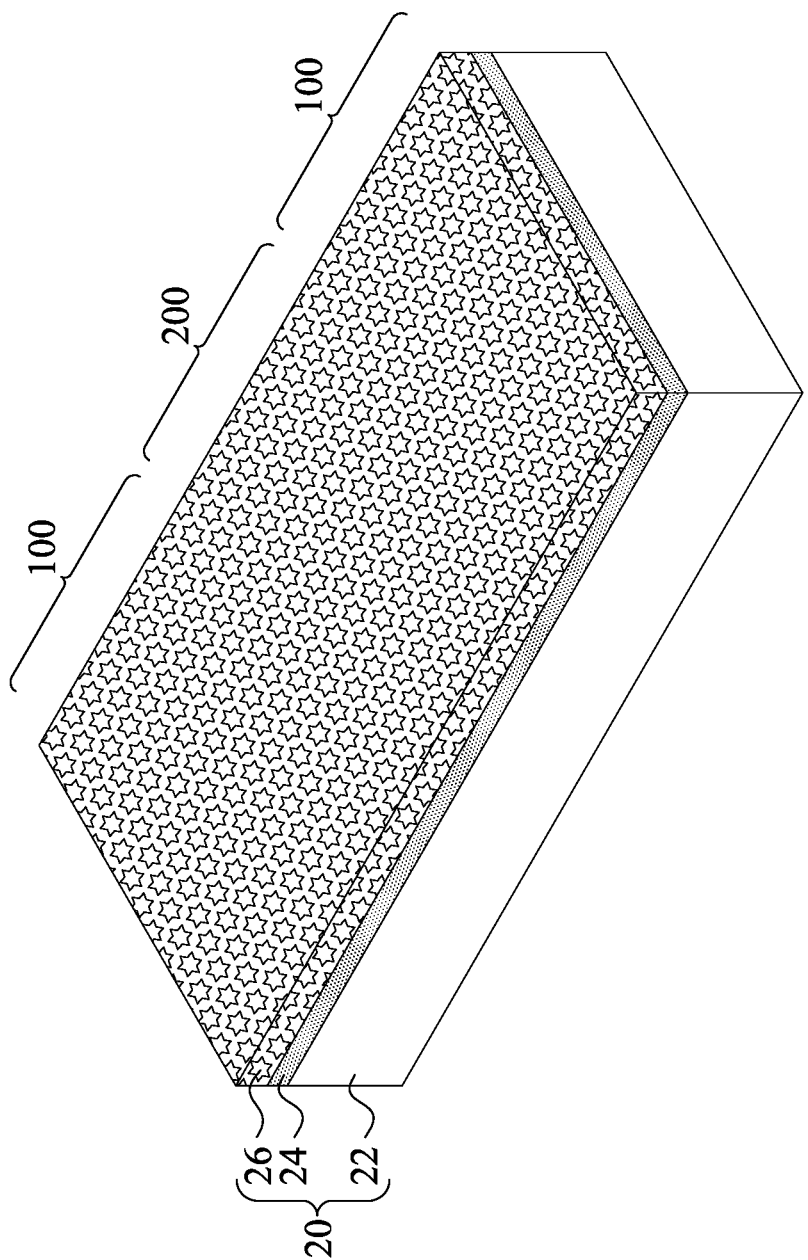
FIGS. 1 through 32 illustrate the cross-sectional views and perspective views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figs. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming Fin Field-Effect Transistors (FinFETs) on a hybrid substrate and the resulting structures are provided in accordance with various exemplary embodiments. The intermediate stages of forming the hybrid substrate and the FinFETs are illustrated in accordance with some embodiments. Some variations of some embodiments are discussed. Throughout the various views and illustrative embodiments, like reference numbers are used to designate like elements.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1 through 16 illustrate the cross-sectional views and perspective view of intermediate stages in the formation of the hybrid substrate and the FinFETs in accordance with some embodiments of the present disclosure.

Referring to FIG. 1, a hybrid substrate 20 is provided. The hybrid substrate 20 includes a crystalline silicon layer 22, a dielectric layer 24 over the silicon layer 22, and a crystalline silicon layer 26 over the dielectric layer 24. The dielectric layer 24 may be formed of silicon oxide or other dielectric materials such as silicon nitride, silicon carbide, etc. The silicon layer 26 is bonded to the dielectric layer 24. The hybrid substrate 20 includes p-type well regions 100 and an n-type well region 200 between the p-type well regions 100. The p-type well regions 100 and the n-type well region 200 are formed, for example, through implantations. The p-type well regions 100 can be equivalently referred to as n-type device regions, and the n-type well region 200 can be equivalently referred to as a p-type device region in some embodiments.

The silicon layer 22 is a (100) substrate having a (100) surface orientation, with the top surface of the silicon layer 22 in the (100) plane of silicon. In accordance with some embodiments of the present disclosure, the silicon layer 26 is a (100) R45 layer, which is formed by rotating a (100) substrate by from about 40 degrees to about 50 degrees before cutting and bonding to dielectric layer 24. As a result, the top surface of the (100) R45 layer has a (100) R45 surface orientation, and the sidewalls of the resulting fins (discussed referring to FIG. 7) are also on the (100) plane of silicon.

Figure 2:
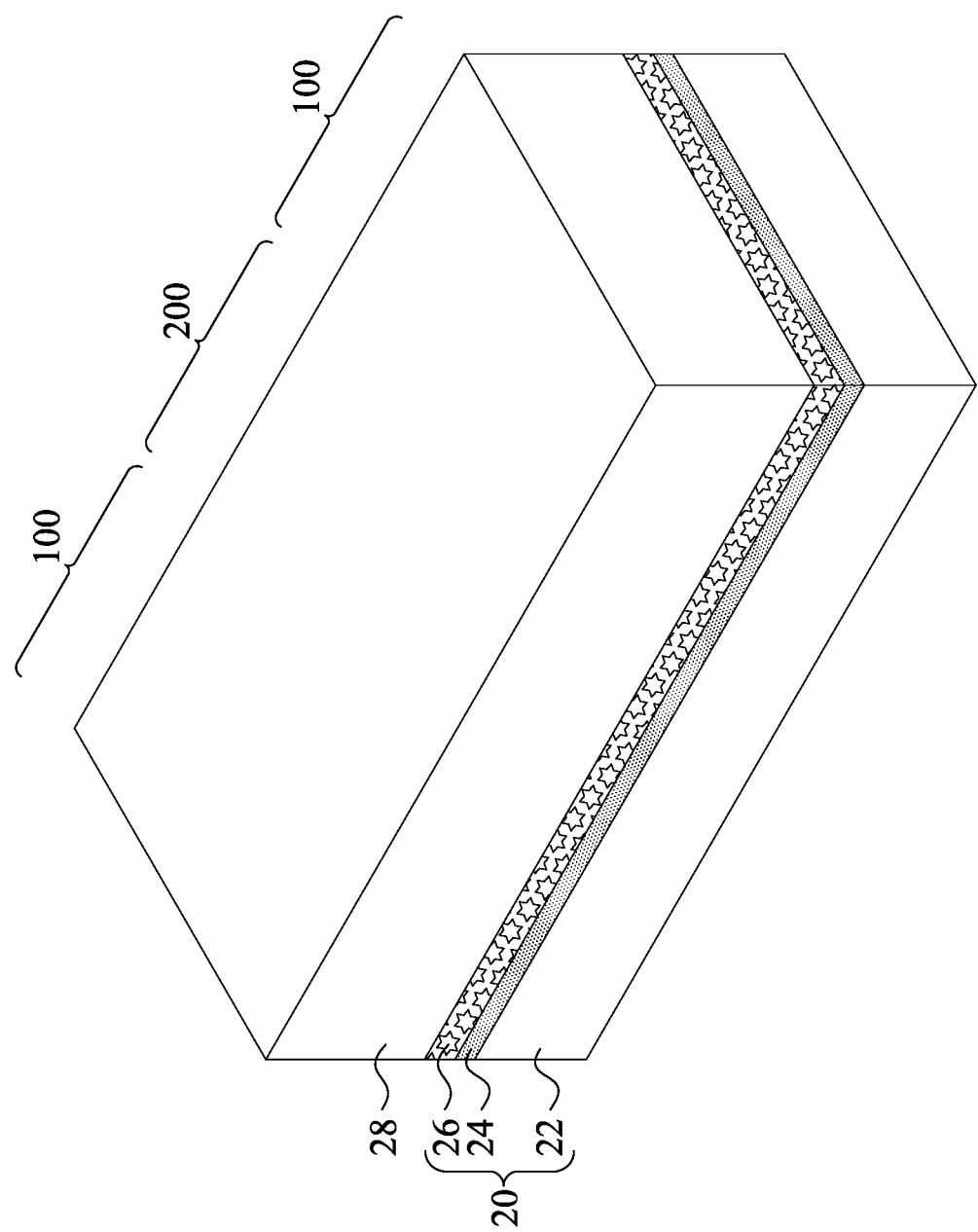

Referring to FIG. 2, an epitaxy is performed to grow a silicon layer 28 on the silicon layer 26. Depending on the orientation of the silicon layer 26, the silicon layer 28 may be a (100) R45 layer. The silicon layer 28 may be free from germanium. Furthermore, the silicon layer 28 may be intrinsic, with no p-type and n-type impurity doped in the epitaxy.

In accordance with alternative embodiments, the silicon layer 28 is in-situ doped with a p-type impurity during the epitaxy. The thickness of silicon layer 28 may be close the fin height of the resulting FinFETs.

Figure 3:
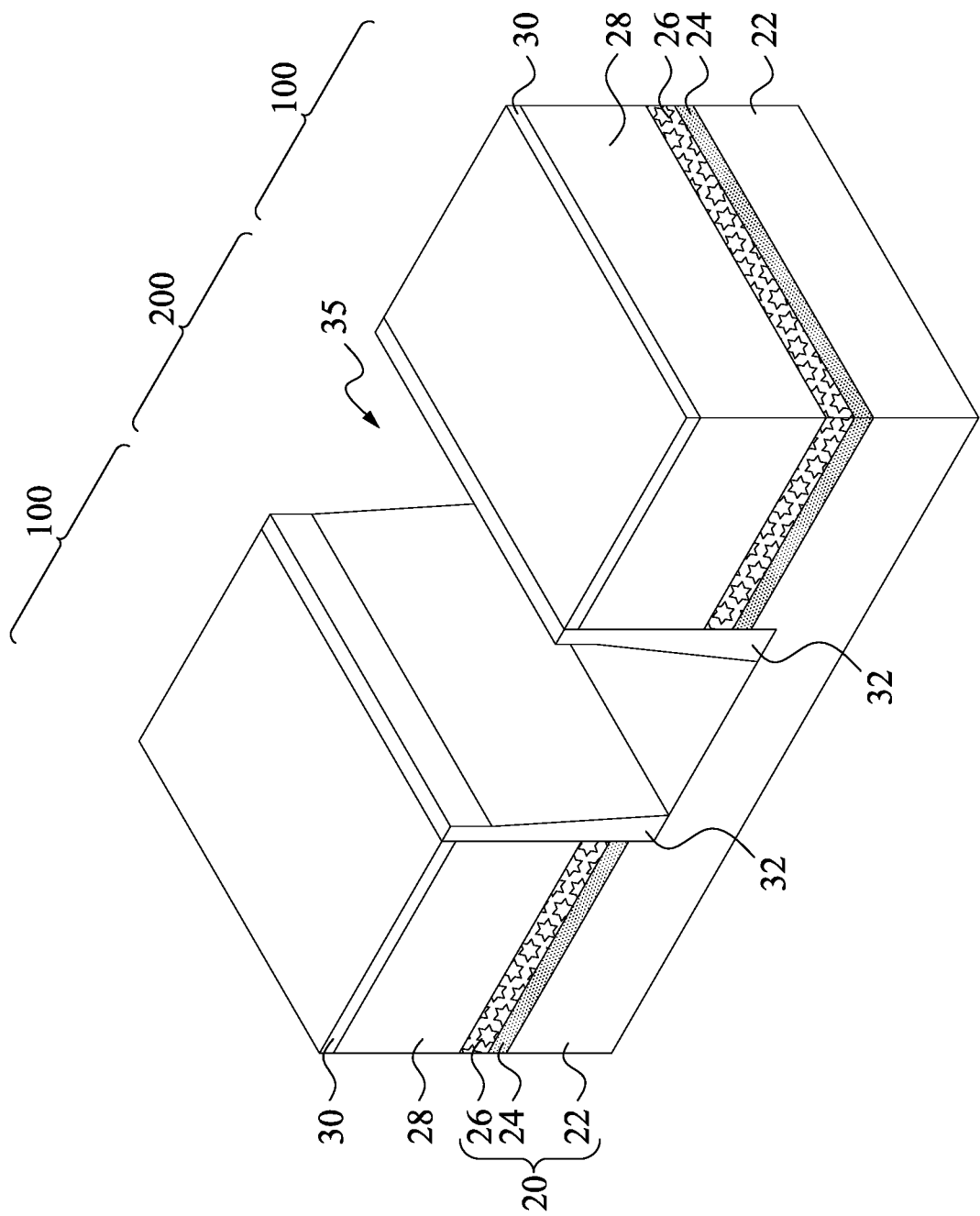

FIG. 3 illustrates the recessing of the silicon layer 28 and the hybrid substrate 20 in the p-type device region 200, and the recessing is not performed in the n-type device regions 100. Recess 35 is thus formed between the n-type device regions 100. In accordance with some embodiments of the present disclosure, to perform the recessing, a capping layer 30 is formed first as a blanket planar layer, for example, through thermal oxidation or deposition. The capping layer 30 may be formed of silicon oxide or other dielectric materials such as silicon nitride, silicon carbide, or silicon oxynitride. The recessing is then performed. During the recessing, the capping layer 30, the silicon layer 28, and the silicon layer 26 are etched-through, exposing the top surface of the underlying dielectric layer 24, which is then etched. The silicon layer 22, which has the (100) surface plane, is thus exposed.

Next, a spacer layer is deposited, followed by an anisotropic etch to remove the horizontal portions of the spacer layer, so that spacers 32 are formed on sidewalls of the recess 35. In accordance with some embodiments of the present disclosure, the spacers 32 are formed of a dielectric material such as silicon oxide ($SiO_2$), silicon nitride, or the like. Due to the different materials for forming the capping layer 30 and the spacers 32, the capping layer 30 remains after the formation of the spacers 32. Hence, both the sidewalls and the top surface of silicon layers 26 and 28 in the n-type device regions 100 are masked.

Figure 4A:
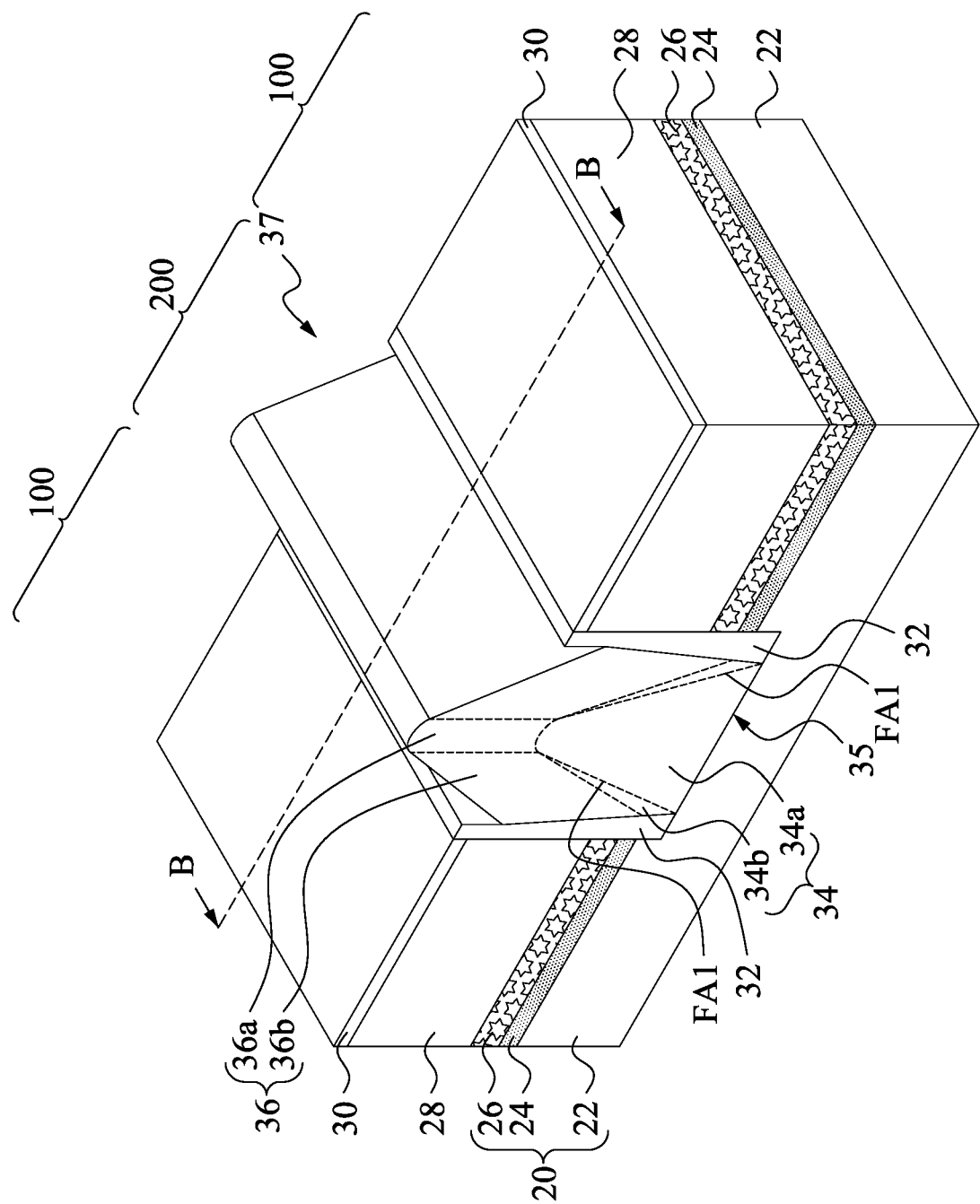
Figure 4B:
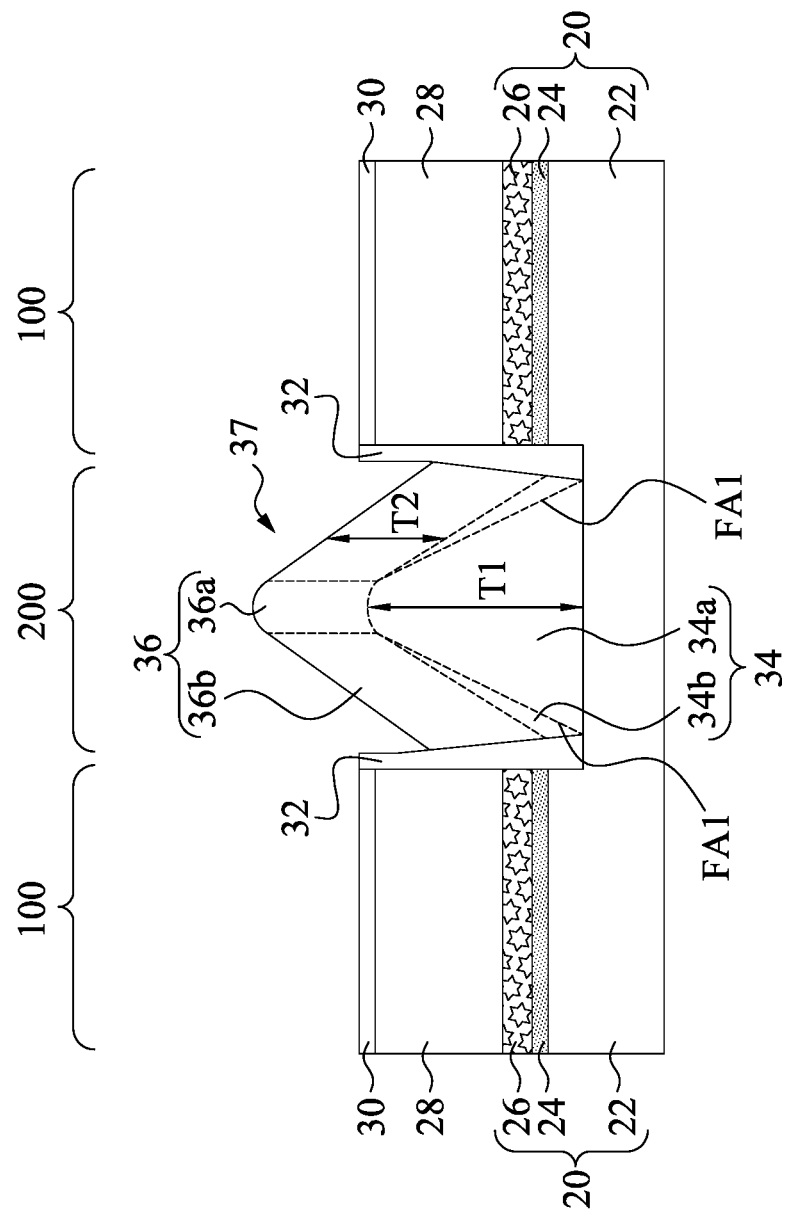

After the spacers 32 are formed, a first epitaxy process and a second epitaxy process are performed in sequence to form first and second epitaxy layers 34 and 36, and the resulting structure is shown in FIGS. 4A and 4B. FIG. 4A illustrates a perspective view of the resulting structure, and FIG. 4B illustrates a cross-sectional view along line B-B in FIG. 4A. The first epitaxy layer 34 is formed over the silicon layer 22, and the second epitaxy layer 36 is formed over the epitaxy layer 34. In accordance with some embodiments of the present disclosure, the first and second epitaxy layers 34 and 36 are formed of a high-mobility semiconductor material such as silicon germanium, germanium (with no silicon), III-V compound semiconductor such as GaAs, InP, GaN, InGaAs, InAlAs, GaSb, AlSb, AlAs, AlP, GaP, combinations thereof, or multi-layers thereof. In some embodiments, the first and second epitaxy layers 34 and 36 may include same materials, for example, SiGe.

The first and second epitaxy processes are selective epitaxy processes. In greater detail, an etching gas such as HCl is added in the process gases, so that the first epitaxy layer 34 is grown from the top surface of silicon layer 22, and not from dielectric materials such as the capping layer 30 and the spacers 32. Similarly, the second epitaxy layer 36 is grown from the first epitaxy layer 34, and not from the dielectric materials. The spacers 32 mask the sidewalls of silicon layers 26 and 28, so that the epitaxy is achieved from a single surface (the top surface of silicon layer 22), and hence defects caused by growing from different surfaces are avoided.

The first epitaxy layer 34 is formed one or more epitaxy or epitaxial (epi) processes, such that semiconductor materials can be formed in a crystalline state on the silicon layer 22. In some embodiments, the one or more epitaxy processes of forming the first epitaxy layer 34 include CVD (chemical vapor deposition) deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the underlying semiconductor materials. In some embodiments where the first epitaxy layer 34 includes SiGe, examples of silicon-containing gases include silane ($SiH_4$) or the like, and examples of germanium-containing gases include germane ($GeH_4$) or the like.

It is observed that due to different growth rates on different surface planes of silicon germanium, facets may be formed. For example, the growth rate on surfaces having (111) surface orientations (referred to as (111) planes) is lower than that on other planes, such as (110) and (100) planes. Accordingly, the facets FA1, which have the (111) surface orientation (in other words, on (111) planes), have the lowest growth rate, which other planes have higher growth rates. In the beginning of the epitaxial growth of the SiGe layer 34, facets FA1 may not be formed. However, with the proceeding of the epitaxial growth, due to the difference in growth rates, facets FA1 are gradually formed. Therefore, in some embodiments where the first epitaxy layer 34 includes silicon germanium, the first epitaxy layer 34 has a first portion 34a grown on the (100) plane of the underlying silicon layer 22 and a second portion 34b grown on the (111) plane of the (111) facets FA1. In other words, the first and second portions 34a and 34b are interfaced at the (111) facets.

Process conditions are selected such that at least the initially grown SiGe portion 34a can achieve a desired germanium concentration (i.e., germanium atomic percentage). However, due to the nature of SiGe epitaxy growth, the germanium concentration of SiGe grown on the (111) plane will be higher than that grown on the (100) plane. As a result, the second portion 34b has a higher germanium concentration than that of the first portion 34a, thus resulting in unwantedly increased germanium concentration in the second portion 34b. In other words, the germanium concentration of the second portion 34b is higher than the germanium concentration of the first portion 34a. For example, the germanium concentration of the second portion 34b and the germanium concentration of the first portion 34a have a difference greater than about 5%. For example, the germanium concentration of the first portion 34a is in a range from about 20% to about 35%, and the germanium concentration of the second portion 34b is in a range from about 25% to about 40%. If the epitaxy process of the first SiGe layer 34 continues until the recess 35 is filled with the second portion 34b, the resulting fins (See FIG. 7) would include a large region (i.e., large second portion 34b) having unwantedly increased germanium concentration and a small region (i.e., small first portion 34a compared to the large second portion 34b) having the desired germanium concentration. For example, a volume percentage of the portion having unwantedly increased germanium concentration in the resulting fin might be from a range about 60% to about 66%, which in turn aggravates non-uniformity of germanium concentration in the resulting fins.

As a result, epitaxy growth of the first SiGe layer 34 stops as long as the epitaxy growth on the (111) plane occurs. Afterwards, process conditions for the SiGe epitaxy process are changed to epitaxially grow the second SiGe layer 36 on the first SiGe layer 34. Less germanium is introduced in the formation of the second SiGe layer 36 than in the formation of the first SiGe layer 34. In this way, the resulting second SiGe layer 36 has a lower germanium concentration than the second portion 34b of the first SiGe layer 34. As a result, the non-uniformity of the germanium concentration in the resulting fins is mitigated in spite of the unwantedly high germanium concentration occurs in the second portion 34b of the first SiGe layer 34. For example, a volume percentage of the portion having unwantedly increased germanium concentration (i.e., second portion 34b of the first SiGe layer 34) in the resulting fin might be from a range about 4% to about 8%, which in turn significantly reduce non-uniformity of germanium concentration in the resulting fins.

Similar to the first SiGe layer 34, the second SiGe layer 36 has a first portion 36a grown on the (100) plane of the underlying first portion 34a of the first SiGe layer 34 and a second portion 36b grown on the (111) plane of second portion 34b of the first SiGe layer 34. Due to the nature of SiGe epitaxy growth, the germanium concentration of SiGe grown on the (111) plane will be higher than that grown on the (100) plane. As a result, the second portion 36b of the second SiGe layer 36 has a higher germanium concentration than that of the first portion 36a of the second SiGe layer 36. Therefore, process conditions of forming the second SiGe layer 36 are selected such that the first portion 36a of the second SiGe layer 36 has a germanium concentration lower than a desired germanium concentration (i.e., germanium concentration of the first portion 34a of the first SiGe layer 34), so as to reduce a germanium concentration difference between the second portion 36b of the second SiGe layer 36 and the first portion 34a of the first SiGe layer 34. In some embodiments, the germanium concentration of the first portion 36a of the second SiGe layer 36 is lower than the germanium concentration of the first portion 34a of the first SiGe layer 34 by at least about 5%. In this way, the germanium concentration of the second portion 36b of the second SiGe layer 36 may be substantially the same as the germanium concentration of the first portion 34a of the first SiGe layer 34, thus resulting in improved uniformity of germanium concentration in the resulting fins. For example, the germanium concentration of the first portion 36a of the second SiGe layer 36 is in range from about 15% to about 30%, and the germanium concentration of the second portion 36b of the second SiGe layer 36 is in a range from about 20% to about 35%.

The formation of the second SiGe layer 36 may be performed in-situ with the formation of the first SiGe layer 34, which means that first and second SiGe layers 34 and 36 are formed in a same process chamber with no vacuum break occurring therebetween. In some exemplary embodiments, the partial pressures, hence flow rates of the germanium-containing gases such as $GeH_4$ are reduced to reduce the germanium concentration in the second SiGe layer 36. In some embodiments, the germanium-containing gas partial pressure difference between growing the first SiGe layer 34 and growing the second SiGe layer 36 is in a range from about 30 mtorr to about 150 mtorr. If the $GeH_4$ partial pressure difference between growing the first SiGe layer 34 and growing the second SiGe layer 36 is greater than about 150 mtorr, the germanium concentration difference between the second portion 36b of the second SiGe layer 36 and the first portion 34a of the first SiGe layer 34 might be unsatisfactory for improving the germanium concentration uniformity in the resulting fins. If the $GeH_4$ partial pressure difference between growing the first SiGe layer 34 and growing the second SiGe layer 36 is less than about 30 mtorr, the germanium concentration difference between the second portion 36b of the second SiGe layer 36 and the first portion 34a of the first SiGe layer 34 might be unsatisfactory for improving the germanium concentration uniformity in the resulting fins. In some embodiments, the first and second epitaxy layers 34 and 36 are in combination referred to as a multi-layer epitaxy structure 37.

Moreover, defects such as misfit dislocations might occur at the interface between the silicon layer 22 and the SiGe structure 37, if the thickness of the SiGe structure 37 is greater than a critical thickness. Stated differently, the critical thickness is a thickness at which misfit dislocations may start to appear. However, the critical thickness associated with the misfit dislocations is in positive correlation of the average germanium concentration in the SiGe structure 37. Because the SiGe structure 37 includes reduced average germanium concentration as discussed above, the critical thickness of the SiGe structure 37 can be increased, which in turn will result in reduced misfit dislocations. In some embodiments, the first SiGe layer 34 has a thickness T1 in a range from about 50 nm to about 70 nm. If the thickness T1 of the first SiGe layer 34 is greater than about 85 nm, misfit dislocations might be increased. In some embodiments, the second SiGe layer 36 has a thickness T2 in a range from about 50 nm to about 100 nm. If the thickness T2 of the second SiGe layer 36 is greater than about 150 nm, misfit dislocations might be increased.

Figure 5A:
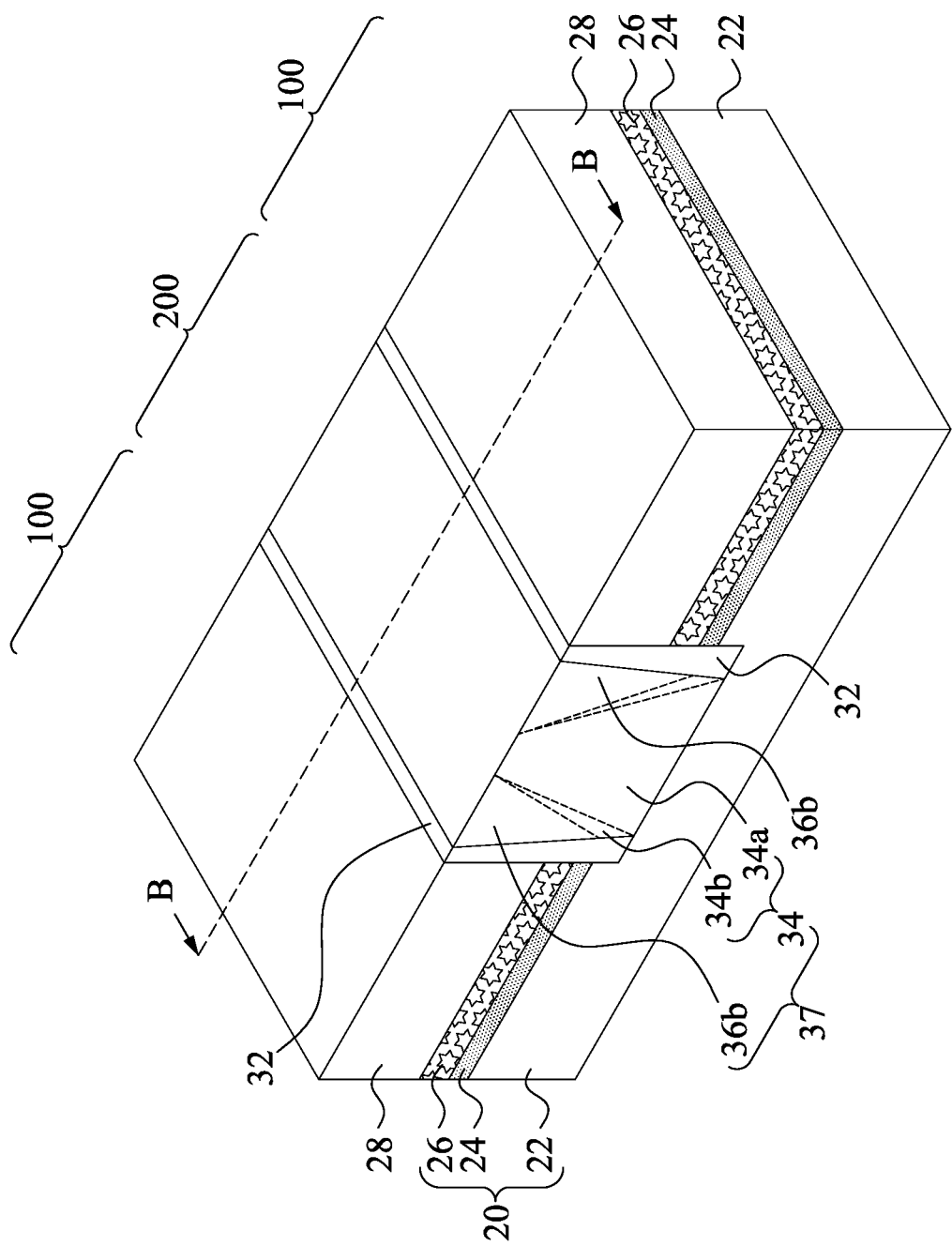
Figure 5B:
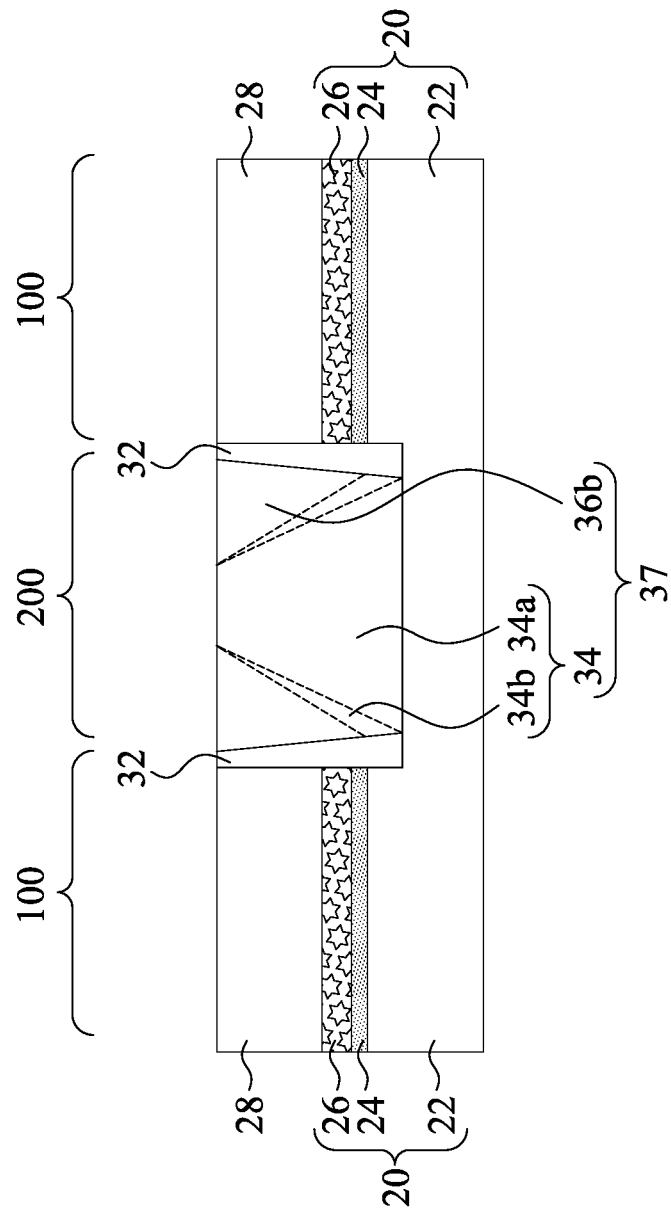

After the epitaxy growth of the SiGe layers 34 and 36, a planarization step such as Chemical Mechanical Polish (CMP) or mechanical grinding is performed to level the top surface of the SiGe structure 37, as shown in FIGS. 5A and 5B. FIG. 5A illustrates a perspective view of the resulting structure, and FIG. 5B illustrates a cross-sectional view along line B-B in FIG. 4A. In accordance with some embodiments of the present disclosure, the planarization is performed using silicon layer 28 as a stop layer. In accordance with alternative embodiments of the present disclosure, the planarization is performed using capping layer 30 as a stop layer, followed by an etching process to remove capping layer 30. In some embodiments, after the CMP process, the first portion 36a of the second SiGe layer 36 is absent from the remaining SiGe structure 37. In alternative embodiments, after the CMP process, the first portion 36a of the second SiGe layer 36 remains in the SiGe structure 37.

Figure 6:
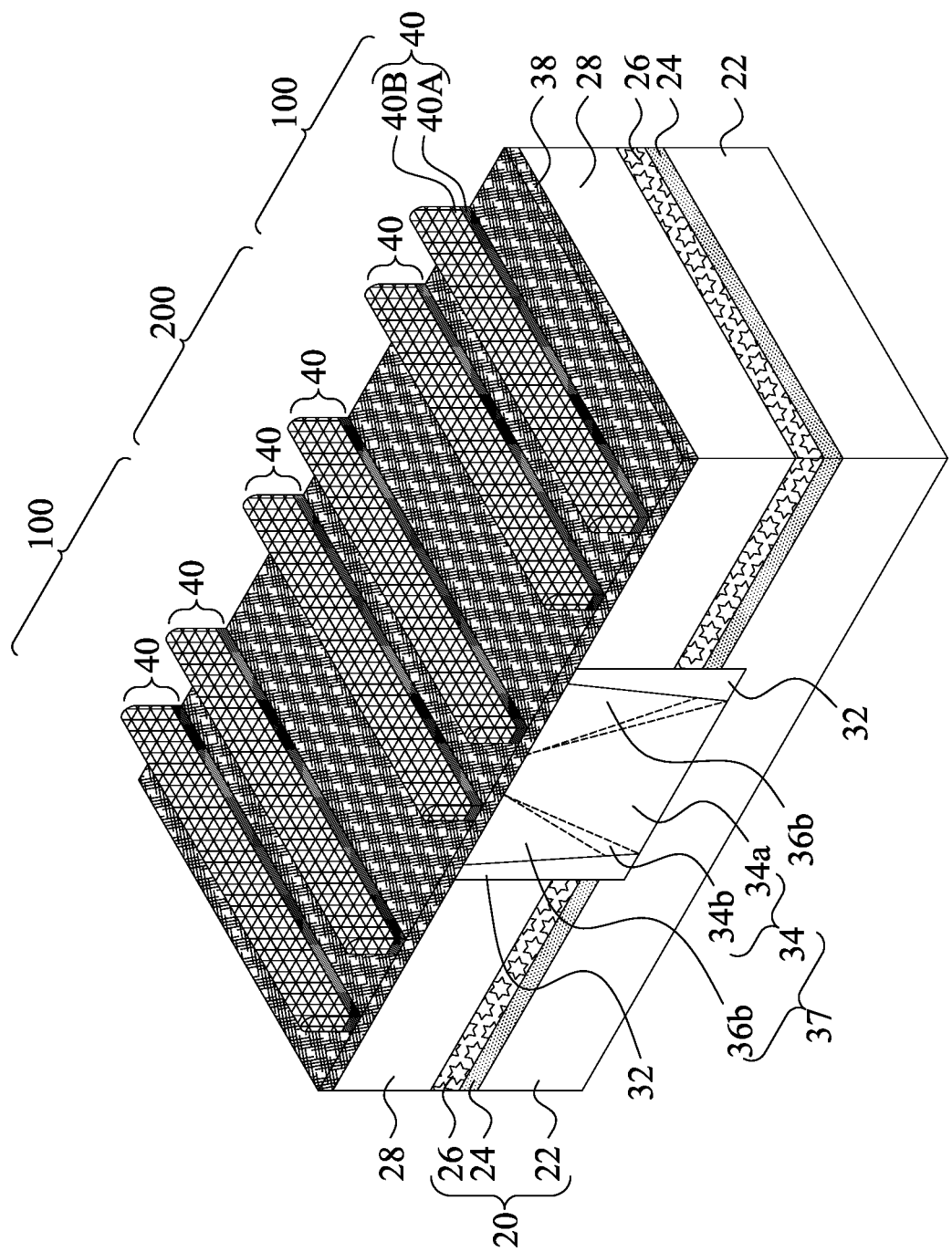

Referring to FIG. 6, a protection layer 38 is formed. In accordance with some embodiments of the present disclosure, the protection layer 38 is formed of silicon, and is deposited on the top surface the structure shown in FIG. 5A. The protection layer 38 is also free from germanium in some embodiments. The deposition may be achieved through an epitaxy process, so that the silicon layer is a crystalline layer. In accordance with alternative embodiments of the present disclosure, the silicon layer 38 is a polysilicon layer.

Figure 7:
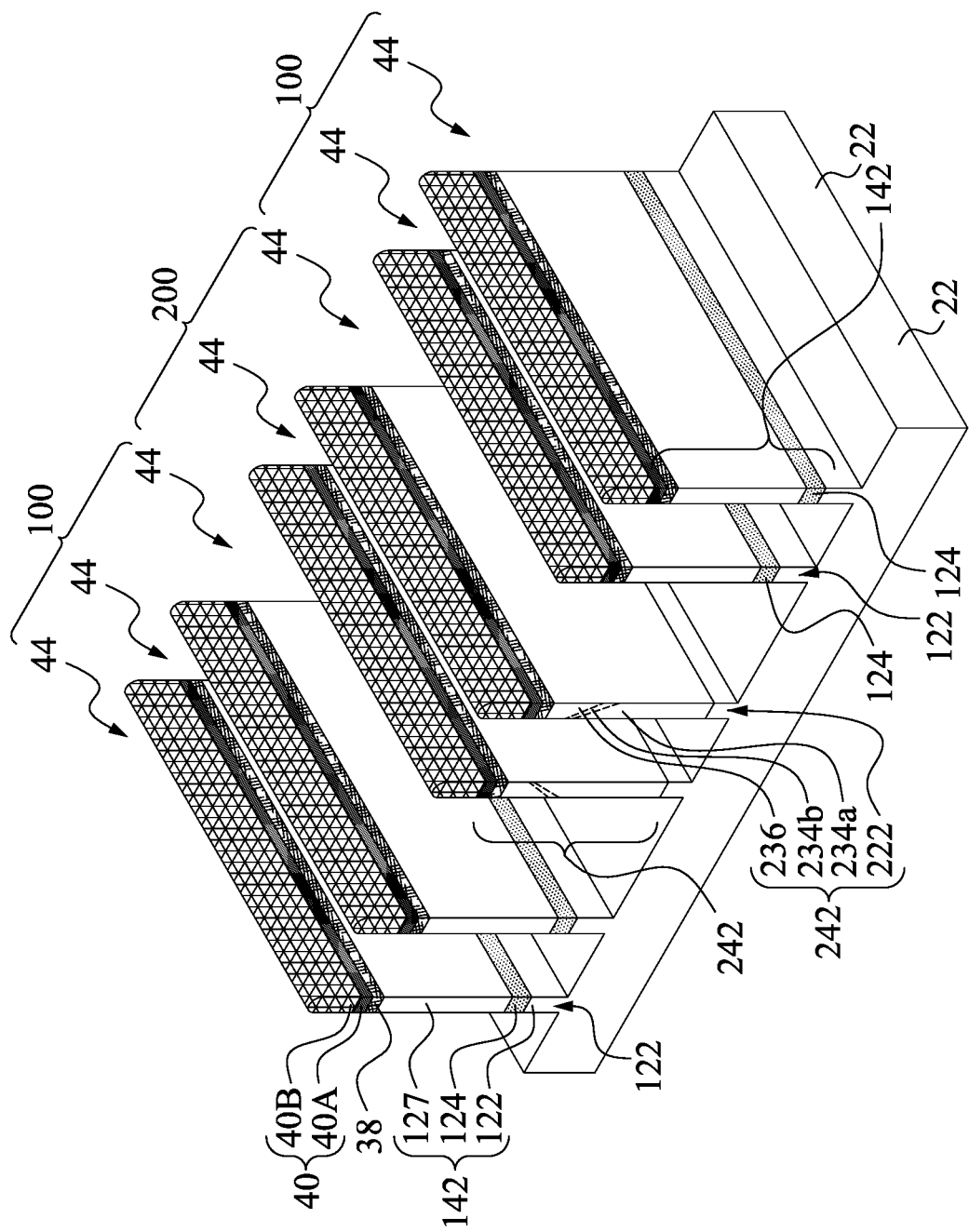

The following steps as shown in FIGS. 6 and 7 illustrate the formation of semiconductor strips. The strips may be patterned by any suitable method. For example, the strips may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the strips.

In accordance with some exemplary embodiments as shown in FIG. 6, mask layer(s) are deposited over the protection layer 38, and are then patterned to form masks 40, which are used as etching mask for forming semiconductor strips. In accordance with some embodiments of the present disclosure, the masks 40 include a plurality of layers formed of different materials. For example, the masks 40 may include layers 40A formed of silicon oxide, and layers 40B over the respective layers 40, with layers 40B formed of silicon nitride. In the formation of the masks 40, the protection layer 38 protects the underlying SiGe structure 37 from being oxidized, for example, due to the elevated temperature adopted in the deposition of the mask layers. Silicon germanium is prone to oxidation, and also has an oxidation rate significantly higher than the oxidation rate of silicon. Accordingly, by forming the protection layer 38, the SiGe structure 37 is protected from the undesirable oxidation.

Referring to FIG. 7, an etching process is performed to etch the hybrid substrate 20 and the epitaxy layers, so that strips 142 and 242 are formed in n-type device regions 100 and p-type device region 200, respectively. Recesses 44 are formed to separate strips 142 and 242. Strips 142 include portions 122, 124, and 127. Strip portions 122 are the remaining portions of the patterned silicon layer 22. Strip portions 124 are the remaining portions of dielectric layer 24 (FIG. 6). Strip portions 127 are the remaining portions of silicon layers 26 and 28 (FIG. 6). In accordance with some embodiments of the present disclosure, silicon layers 26 and 28 are (100) R45 layers. Strips 242 include portions 222, 234a and 234b and 236. Strip portions 222 are the remaining portions of the patterned silicon layer 22. Strip portions 234a are remaining portions of first portion 34a of the first SiGe layer 34 (FIG. 6). Strip portions 234b are remaining portions of the second portion 34b of the first SiGe layer 34 (FIG. 6). Strip portions 236 are the remaining portions of the second portion 36b of the second SiGe layer 36 (FIG. 6). Accordingly, strip portions 234a and 236 are SiGe portions and have substantially the same germanium concentration, as discussed previously with respect to FIGS. 4A and 4B. Strip portions 234b are SiGe portions having higher germanium concentrations than strip portions 234a and 236, as discussed previously with respect to FIGS. 4A and 4B. In some embodiments, a germanium concentration difference between the strip portions 234a and 234b is greater than a germanium concentration difference between the strip portions 234a and 236, and a germanium concentration difference between the strip portions 234b and 236 is greater than the germanium concentration difference between the strip portions 234a and 236 as well.

Figure 8:
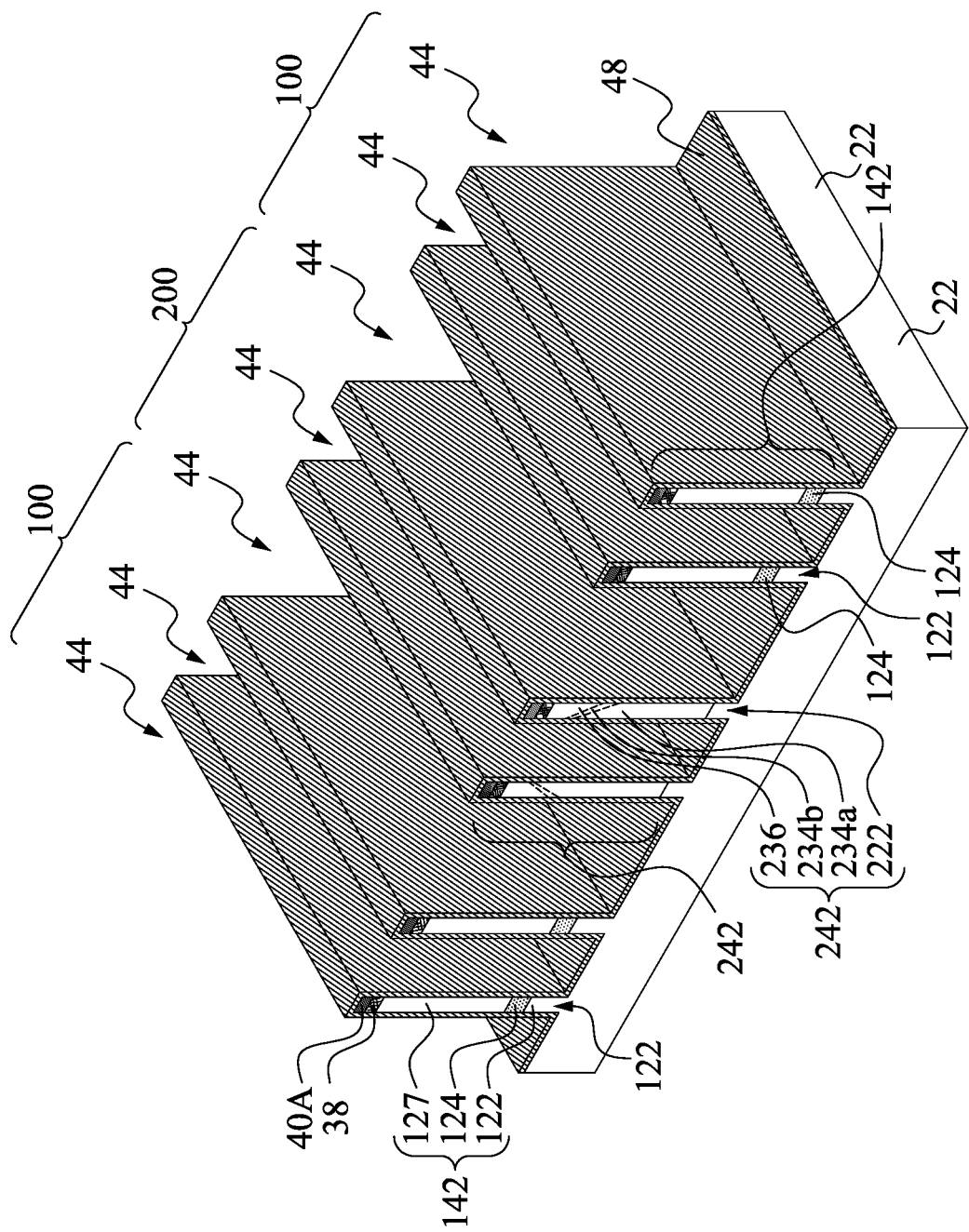

FIG. 8 illustrates the formation of a liner 48, which is used to mask the sidewalls of SiGe strip portions 234a, 234b and 236 from oxidation. In accordance with some embodiments of the present disclosure, the liner 48 is formed of silicon, and is free from or substantially free from germanium. Furthermore, liner 48 may be free from oxygen and nitrogen, and hence does not include silicon oxide and silicon nitride. The formation of liner 48 may be performed using a conformal deposition method such as Atomic Layer Deposition (ALD) or Chemical Vapor Deposition (CVD).

Figure 9:
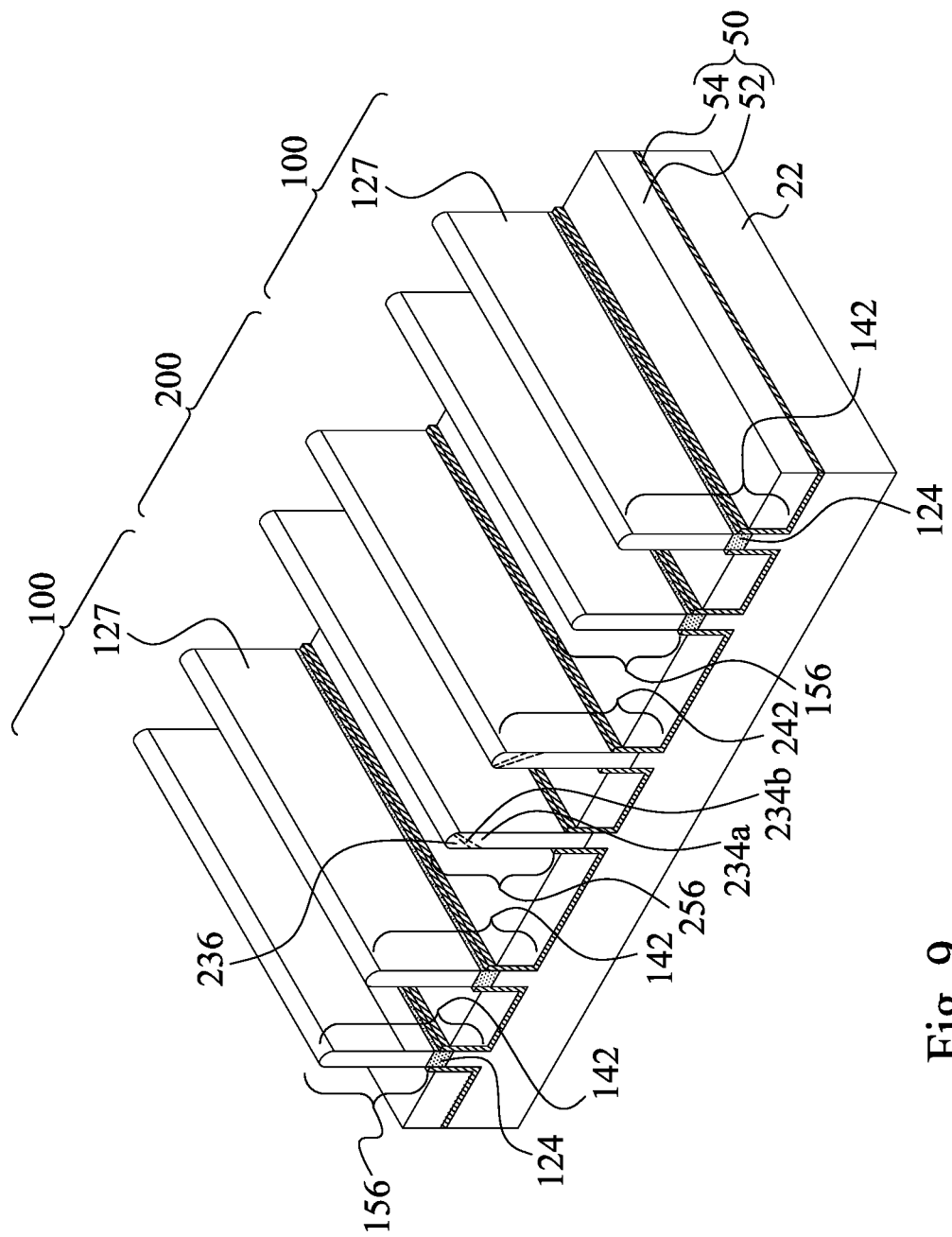

FIG. 9 illustrates the formation of STI (Shallow Trench Isolation) regions 50, which includes dielectric liners 52 and dielectric regions 54 over dielectric liners 52. In accordance with some embodiments of the present disclosure, a conformal deposition method is used to deposit a conformal dielectric liner 52 on the exposed surfaces of the structure shown in FIG. 8. For example, dielectric liners 52 may be formed using ALD or CVD. Next, the remaining portions of recesses 44 (FIG. 8) are filled with a dielectric material 54. The dielectric material 54 may be formed using Flowable Chemical Vapor Deposition (FCVD), spin-on coating, or the like. In accordance with some embodiments in which FCVD is used, a silicon-and nitrogen-containing precursor (for example, trisilylamine (TSA) or disilylamine (DSA)) is used, and hence the resulting dielectric material is flowable (jelly-like). In accordance with alternative embodiments of the present disclosure, the flowable dielectric material is formed using an alkylamino silane based precursor. During the deposition, plasma is turned on to activate the gaseous precursors for forming the flowable oxide.

In the formation of the dielectric liners 52 and the dielectric regions 54, the temperature of the formation process may be elevated, which is likely to cause the oxidation of the SiGe strip portions 234a, 234b and 236 if the strip portions 234a, 234b and 236 are exposed. The liner 48 (FIG. 8) thus protects the SiGe strip portions 234a, 234b and 236 from the oxidation. As a result, the liner 48, (or at least the portions of the liner 48 contacting strip portions 124, 127, 234a, 234b and 236) may be oxidized during the formation of dielectric liners 52 and dielectric regions 54, and hence is converted into a silicon oxide layer.

Next, a planarization such as CMP or mechanical grinding is performed on the dielectric regions 54 and the dielectric liners 52. The planarization may be performed using masks 40 (FIG. 8) as a stop layer. Next, the masks 40 are removed, followed by recessing the dielectric regions 54 and the dielectric liners 52. The resulting structure is shown in FIG. 9. The remaining portions of the dielectric regions 54 and the dielectric liners 52 are referred to as the STI regions 50. In accordance with some embodiments of the present disclosure, the recessing is performed until the recessed STI regions 50 have their top surfaces lower than the top surfaces of the dielectric strip portions 124, so that the sidewalls of the dielectric strip portions 124 have at least some portions exposed. In accordance with alternative embodiments of the present disclosure, the recessed STI regions 50 have their top surfaces level with, higher than, or lower than the bottom surfaces of the dielectric strip portions 124. Throughout the description, the portions of the strips 142 and 242 higher than the top surfaces of the STI regions 50 are referred to as fins (or protruding fins) 156 and 256. The fin 156 has a top end in a position higher than a top end of an interface between the strip portion 234b and the strip portion 236. An interface between the strip portion 124 and the strip portion 127 is in a position lower than a bottom end of the interface between the strip portion 234b and the strip portion 236.

Figure 10:
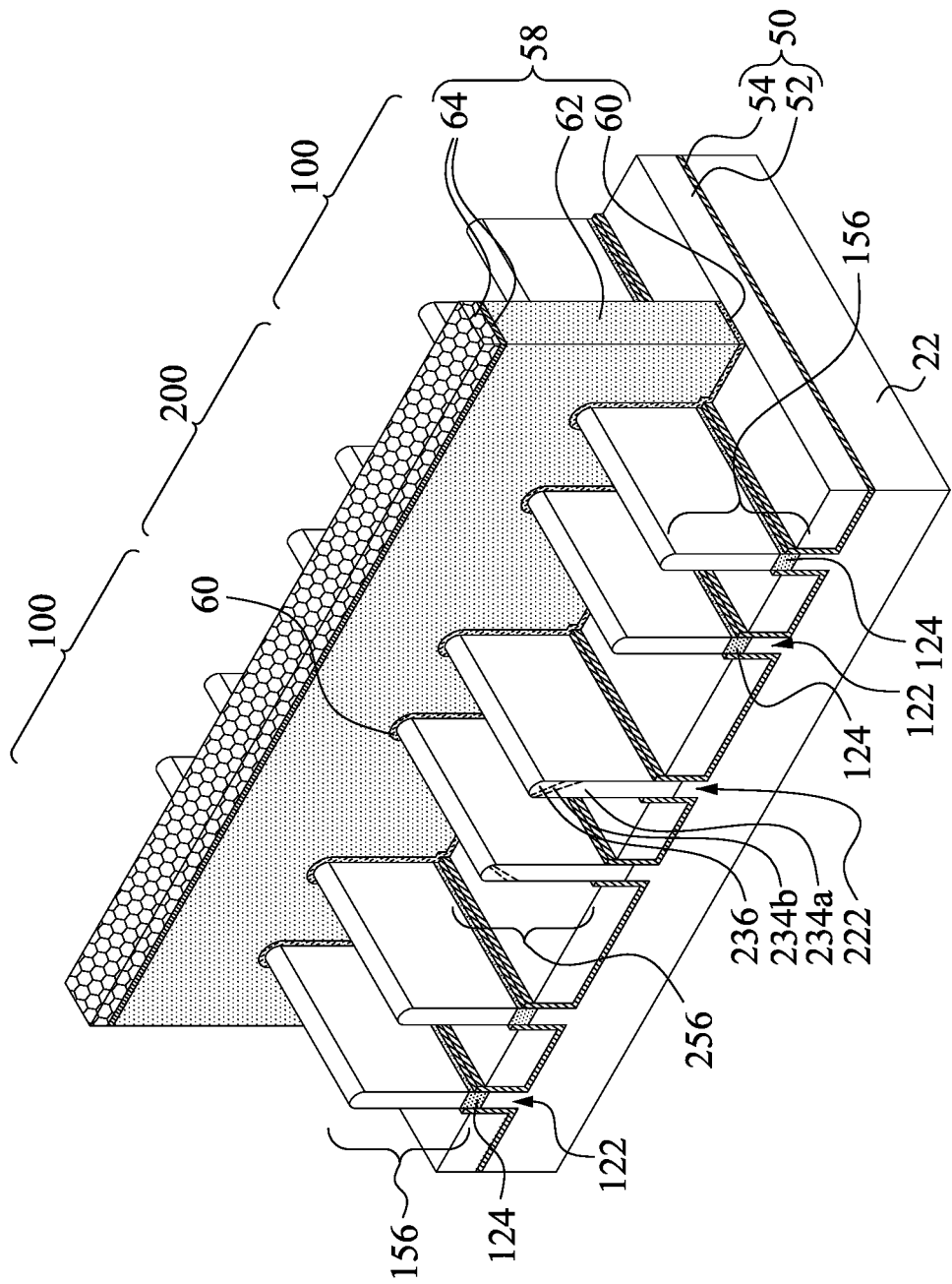

Referring to FIG. 10, a dummy gate stack 58 is formed on the top surfaces and the sidewalls of (protruding) fins 156 and 256. It is appreciated that although one dummy gate stack 58 is illustrated for clarity, there may be a plurality of dummy gate stacks formed, which are parallel to each other, with the plurality of dummy gate stacks crossing the same semiconductor fin(s) 156 and 256. The dummy gate stack 58 may include a dummy gate dielectric 60 and a dummy gate electrode 62 over the dummy gate dielectric 60. The dummy gate electrode 62 may be formed, for example, using polysilicon, and other materials may also be used. The dummy gate stack 58 may also include one (or a plurality of) hard mask layer 64 over the dummy gate electrode 62. The hard mask layer 64 may be formed of silicon nitride, silicon carbo-nitride, or the like. The dummy gate stack 58 may cross over a single one or a plurality of protruding fins 156 and 256 and/or STI regions 50. The dummy gate stack 58 also has a lengthwise direction perpendicular to the lengthwise directions of protruding fins 156 and 256.

Figure 11:
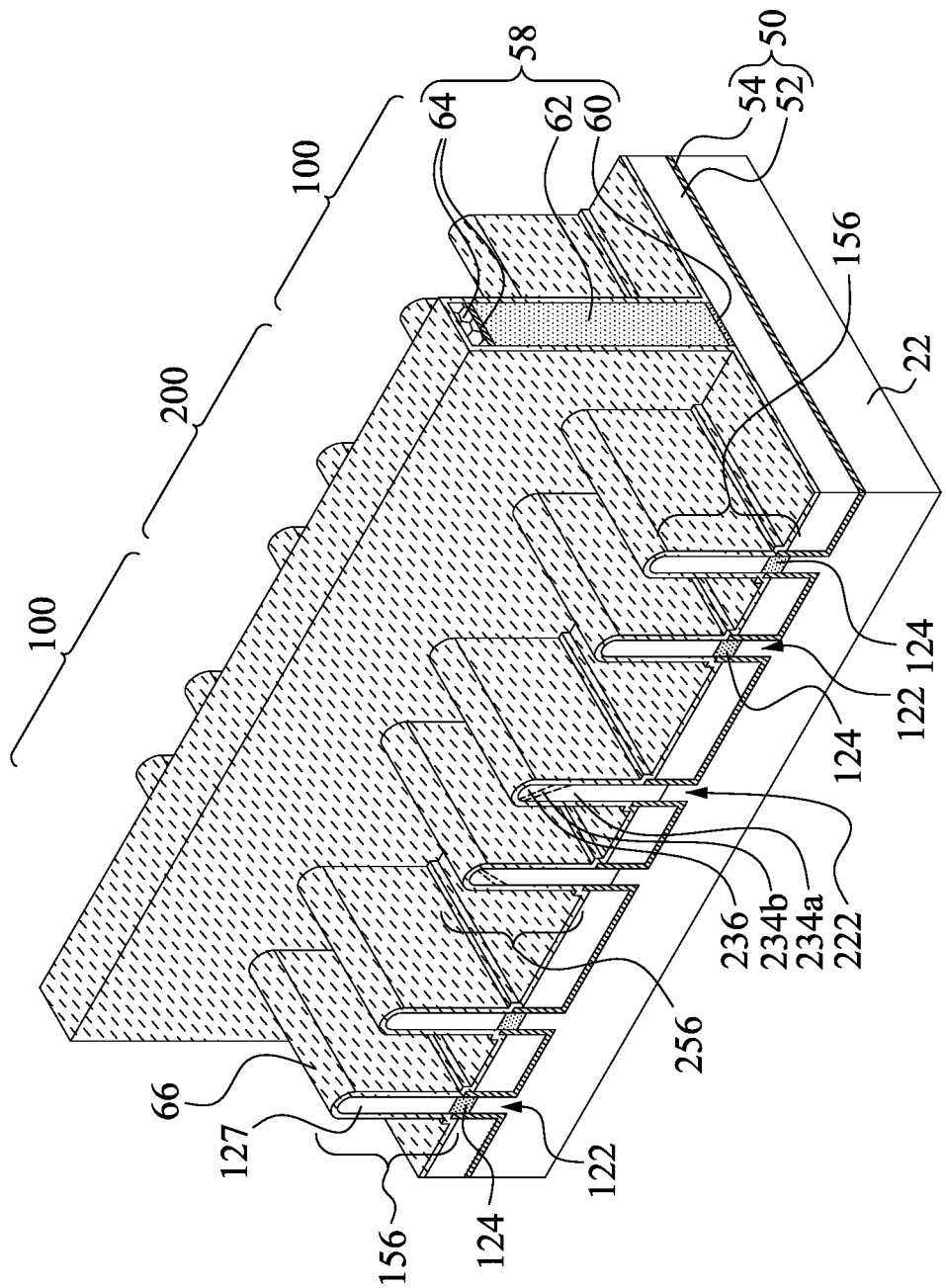

Next, referring to FIG. 11, a spacer layer 66 is deposited. In accordance with some embodiments of the present disclosure, the spacer layer 66 is formed of a dielectric material such as silicon nitride, silicon carbon-oxyitride (SiCN), or the like, and may have a single-layer structure or a multi-layer structure including a plurality of dielectric layers. The formation may be performed through a conformal deposition method such as ALD or CVD.

Figure 12:
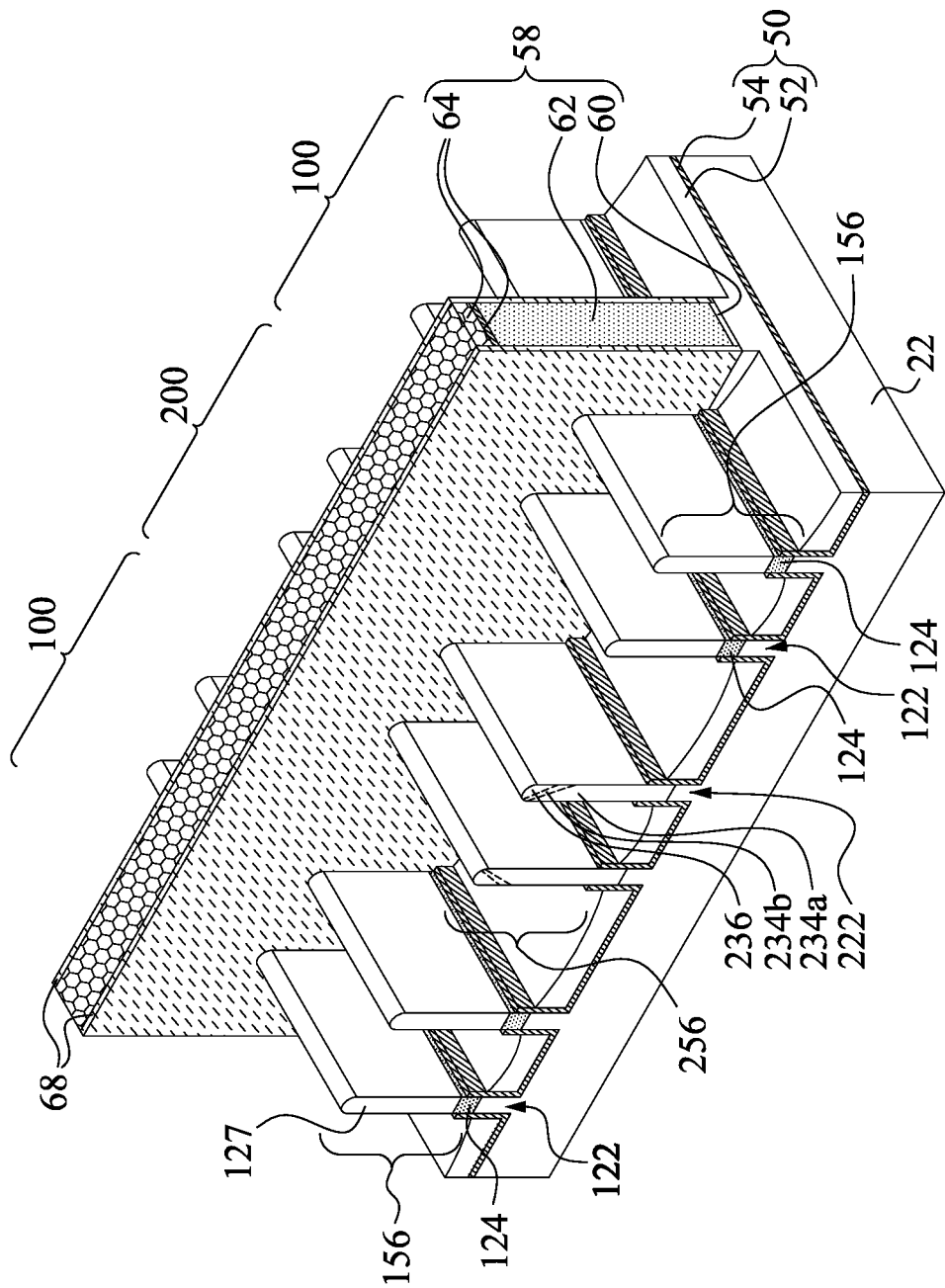

FIG. 12 illustrates the etching of the spacer layer 66, resulting in the formation of gate spacers 68 on the sidewalls of the dummy gate stack 58. The etching is performed anisotropically, so that the portions of the spacer layer 66 on protruding fins 156 and 256 are removed.

Figure 13:
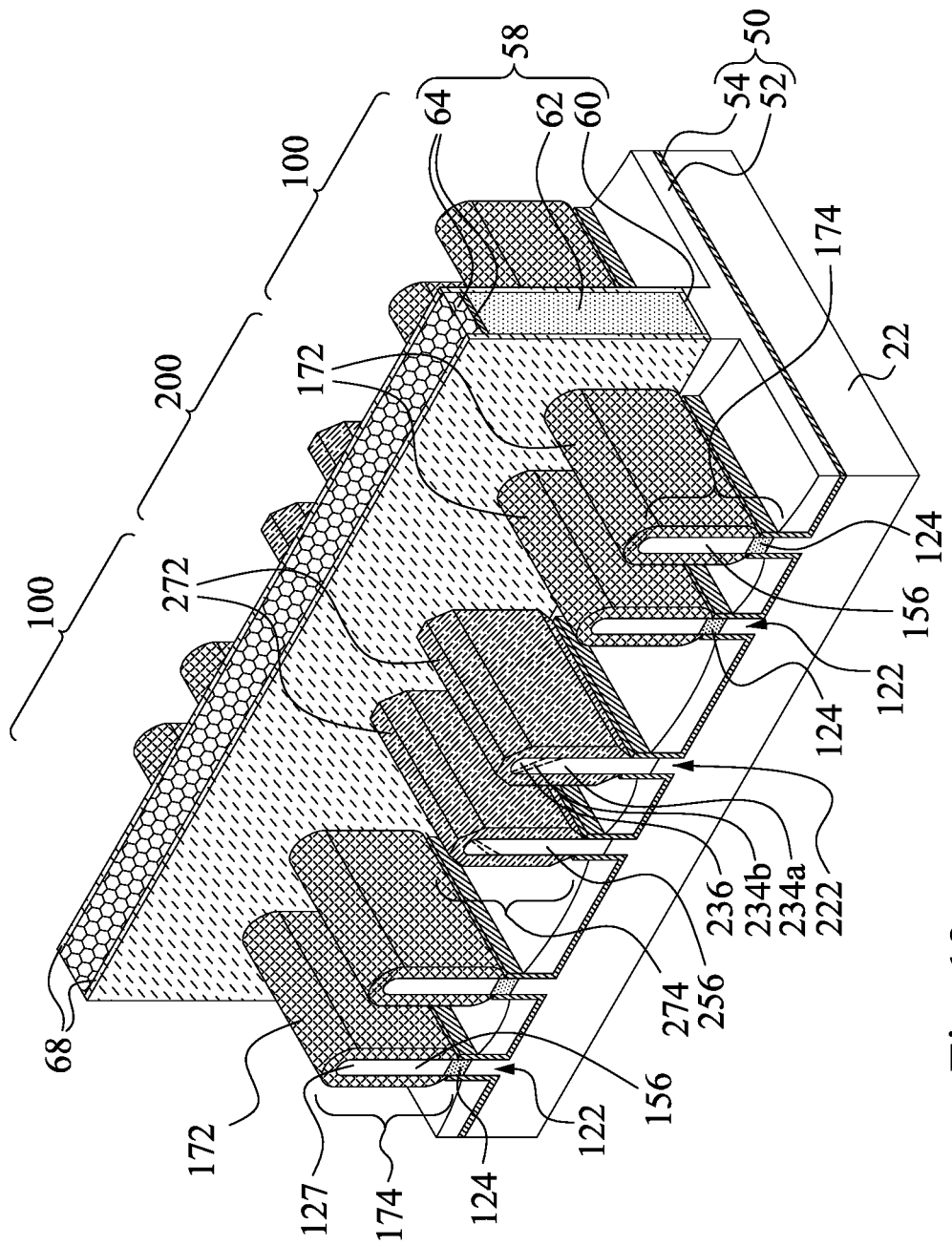

Next, epitaxy regions 172 and 272 are formed by selectively growing semiconductor materials on protruding fins 156 and 256, respectively, resulting in the structure in FIG. 13. Epitaxy regions 172 and 272 are epitaxially grown in different epitaxy processes, with each including forming a mask layer (not shown) on one of the epitaxy regions 172 and 272, so that the epitaxy regions may be formed on the other one of epitaxy regions 172 and 272. Depending on whether the resulting FinFET is a p-type FinFET or an n-type FinFET, a p-type or an n-type impurity may be in-situ doped with the proceeding of the epitaxy. For example, epitaxy regions 172 in the n-type device regions 100 may be formed of silicon phosphorous (SiP) or silicon carbon phosphorous (SiCP), and epitaxy regions 272 in the p-type region 200 may be formed of silicon germanium boron (SiGeB).

After the epitaxy step, epitaxy regions 172 and strip portions 127 may be further implanted with an n-type impurity to form source and drain regions 174 for the n-type FinFET. Epitaxy regions 272 and strip portions 234a, 234b and 236 may also be implanted with a p-type impurity to form source and drain regions 274 for the p-type FinFET. In accordance with alternative embodiments of the present disclosure, the implantation step is skipped when epitaxy regions 172 and 272 are in-situ doped with the p-type or n-type impurity during the epitaxy.

Although FIG. 13 illustrates that the source/drain regions 174 are separated from each other, and the source/drain regions 274 are separated from each other, it is realized that depending on how long the epitaxy processes last, the source/drain regions 174 may be merged with each other or remain separated from each other, and the source/drain regions 274 may be merged with each other or remain separated from each other. Also, the shapes of the epitaxy regions 172 and 272 may be similar to what is shown, or have other shapes such as spade/diamond shapes.

Figure 14:
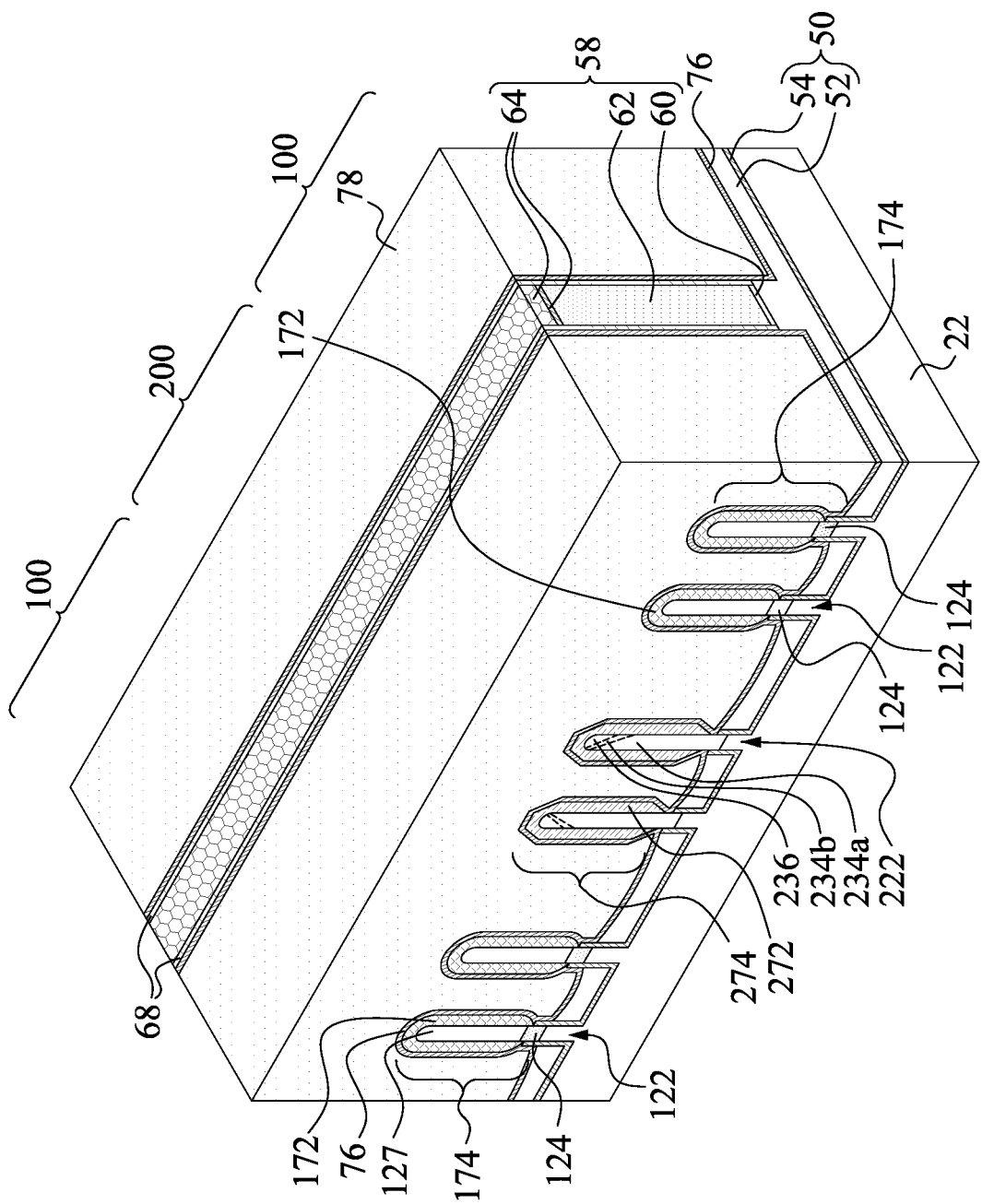

FIG. 14 illustrates a perspective view of the structure with a contact etch stop layer (CESL) 76 and an Inter-Layer Dielectric (ILD) 78 being formed. The CESL 76 may be formed of silicon nitride, silicon carbo-nitride, or the like. The CESL 76 may be formed using a conformal deposition method such as ALD, for example. The ILD 78 may include a dielectric material formed using, for example, FCVD, spin-on coating, CVD, or other deposition methods. ILD 78 may also be formed of Tetra Ethyl Ortho Silicate (TEOS) oxide, Plasma Enhanced CVD (PECVD) oxide (SiO$_2$), Phospho-Silicate Glass (PSG), Boro-Silicate Glass (BSG), Boron-Doped Phospho-Silicate Glass (BPSG), or the like. A planarization step such as CMP or mechanical grinding may be performed to level the top surfaces of the ILD 78, the dummy gate stack 58, and the gate spacers 68 with each other.

Figure 15:
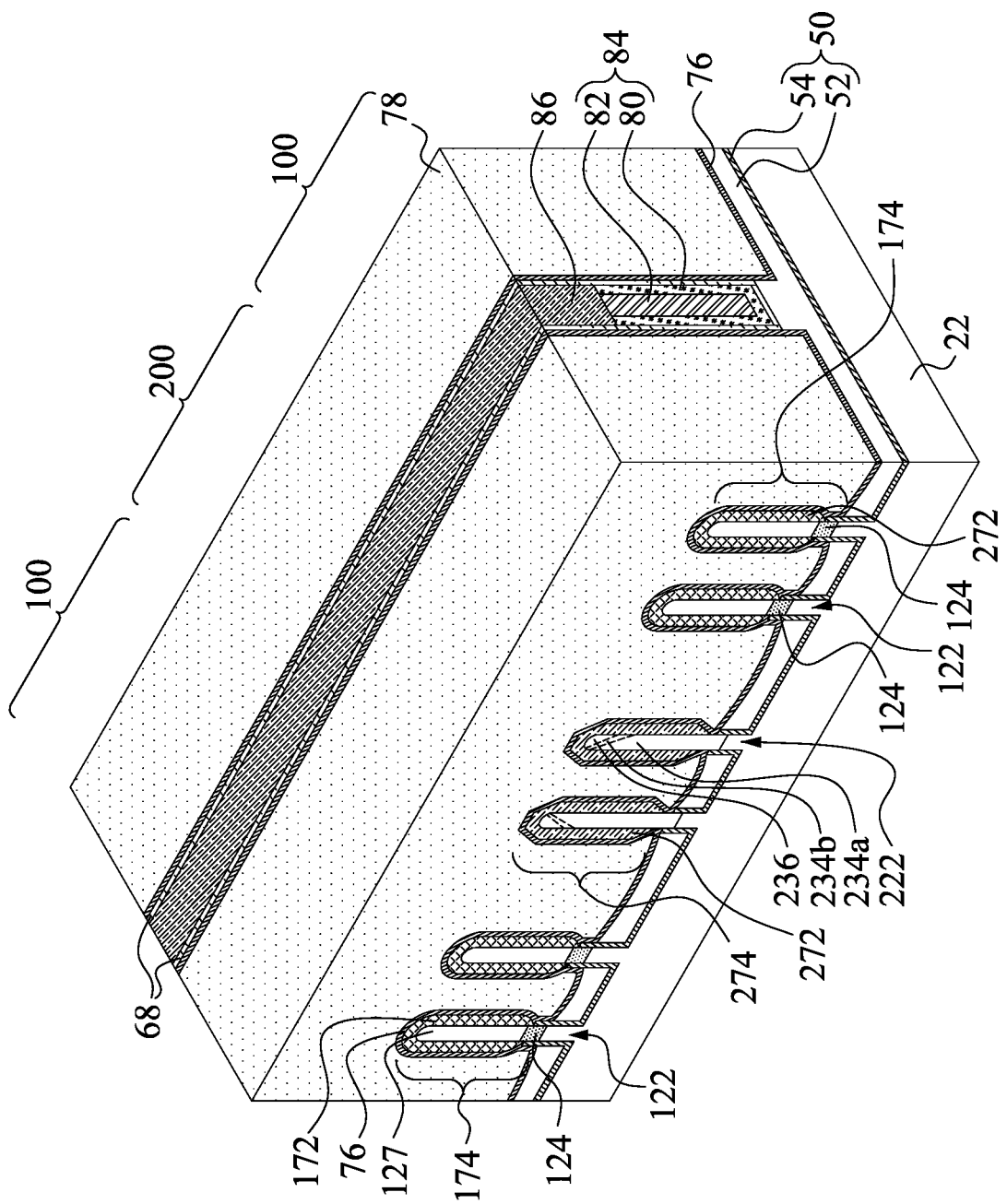

Next, the dummy gate stack 58, which include hard mask layer 64, the dummy gate electrode 62 and the dummy gate dielectric 60, is replaced with replacement gate stack 84, which include metal gates 82 and replacement gate dielectrics 80 as shown in FIG. 15. In the removal of dummy gate stacks 58, dielectric strip portions 124 (FIG. 9) that were previously buried under the dummy gate stacks are exposed, and are at least recessed laterally due to the similarity of its material to the material of the dummy gate dielectric. In accordance with some embodiments of the present disclosure, an additional etching process, which may be a wet etching process, is further performed after the removal of the dummy gate stack if the material of strip portions 124 is different from that of STI regions 50, so that strip portions 124 are removed without damaging STI regions 50.

When replacing gate stacks, hard mask layers 64, dummy gate electrodes 62 and dummy gate dielectrics 60 (FIG. 14) are first removed in one or a plurality of etching steps, resulting in a trench (opening) to be formed between gate spacers 68. In the formation of the replacement gates, a gate dielectric layer 80 (FIG. 15) is first formed, which extends into the trench left by the removed dummy gate stack, and may have a portion extending over ILD 78. In accordance with some embodiments of the present disclosure, the gate dielectric 80 includes an interfacial layer (IL, not shown separately) as its lower part. The IL may include an oxide layer such as a silicon oxide layer, which is formed through a chemical oxidation process or a deposition process. The gate dielectric 80 may also include a high-k dielectric layer formed over the IL. The high-k dielectric layer is formed as a conformal layer, and includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. In accordance with some embodiments of the present disclosure, the high-k dielectric layer in gate dielectric 80 is formed using ALD or CVD.

The fate electrode 82 is formed over the gate dielectric 80 and filling the remaining portion of the trench. The formation of the gate electrode 82 may include a plurality of deposition processes to deposit a plurality of conductive layers, and performing a planarization step to remove the excess portions of the conductive layers over the ILD 78. The deposition of the conductive layers may be performed using conformal deposition methods such as ALD or CVD.

The gate electrode 82 may include a diffusion barrier layer and one (or more) work-function layer over the diffusion barrier layer. The diffusion barrier layer may be formed of titanium nitride (TiN), which may (or may not) be doped with silicon to form TiSiN. The work-function layer determines the work function of the gate, and includes at least one layer, or a plurality of layers formed of different materials. The specific material of the work-function layer is selected according to whether the respective FinFET is an n-type FinFET or a p-type FinFET. For example, for the n-type FinFET in device regions 100, the work-function layer may include a TaN layer and a titanium aluminum (TiAl) layer over the TaN layer. For the p-type FinFET in device region 200, the work-function layer may include a TaN layer, a TiN layer over the TaN layer, and a TiAl layer over the TiN layer. After the deposition of the work-function layer(s), another barrier layer, which may be another TiN layer, is formed. The gate electrode 82 may also include a filling metal, which may be formed of tungsten or cobalt, for example. After the formation of the replacement gate stack 84, the replacement gate stack 84 is etched back, and dielectric hard mask 86 is formed over the etched-back replacement gate 84.

Figure 16:
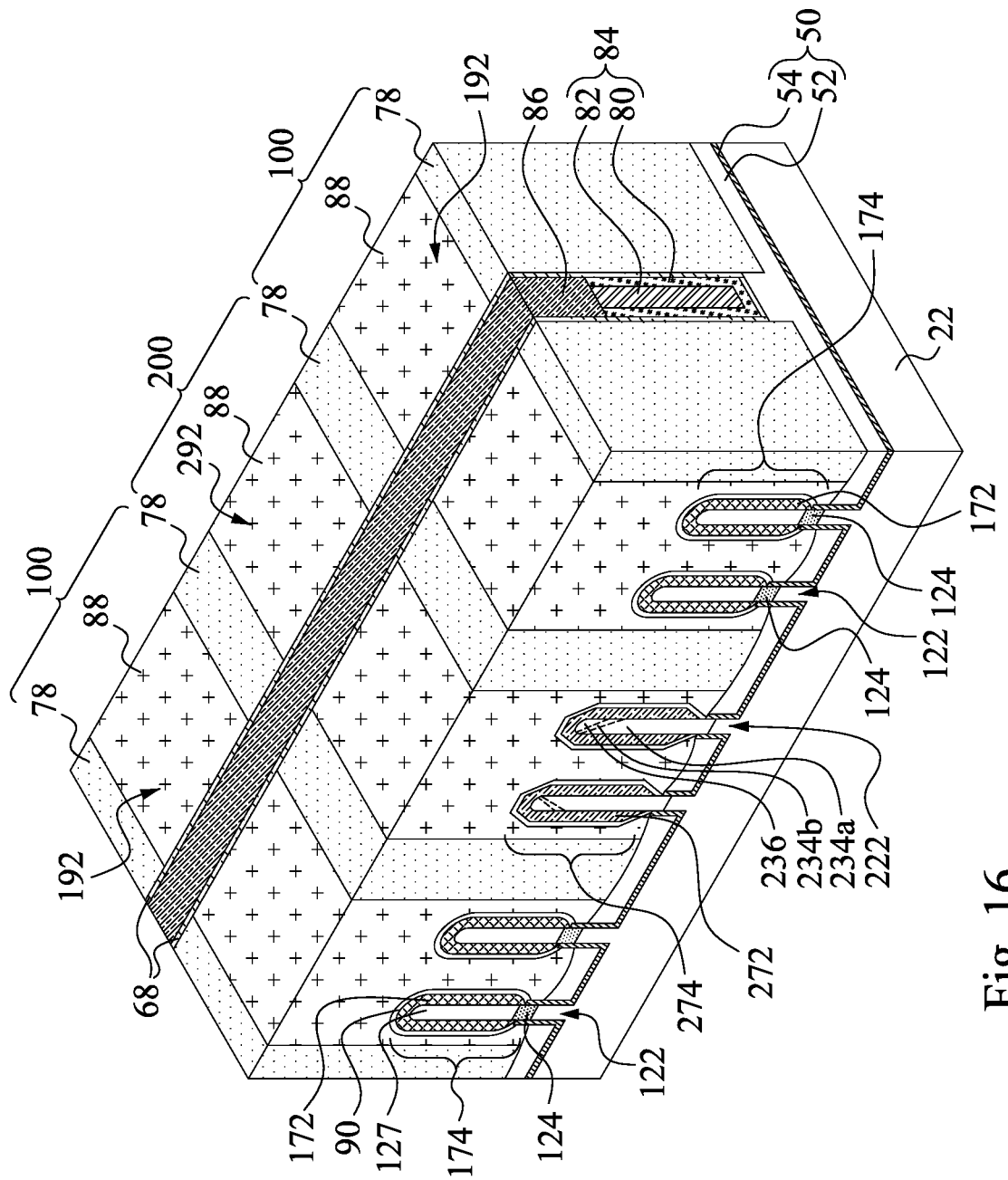

After the structure as shown in FIG. 15 is formed, the ILD 78 and the CESL 76 are etched to form contact openings. The etching may be performed using, for example, Reactive Ion Etch (RIE). In a subsequent step, as shown in FIG. 16, source/drain contact plugs 88 are formed in the contact openings. Before forming the contact plugs 88, the portions of CESL 76 exposed to the contact opens are first etched, revealing epitaxy regions 172 and 272. Silicide regions 90 are then formed on the epitaxy regions 172 and 272. In accordance with some embodiments of the present disclosure, the contact plugs 88 include barrier layers and a metal-containing material over the respective barrier layers. In accordance with some embodiments of the present disclosure, the formation of the contact plugs 88 includes forming a blanket barrier layer and a metal-containing material over the blanket barrier layer, and performing a planarization to remove excess portions of the blanket barrier layer and the metal-containing material. The barrier layer may be formed of a metal nitride such as titanium nitride or tantalum nitride. The metal-containing material may be formed of tungsten, cobalt, copper, or the like. N-type FinFETs 192 and a p-type FinFET 292 are thus formed.

FIGS. 17 through 32 illustrate the cross-sectional views and perspective views of intermediate stages in the formation of the hybrid substrate and the FinFETs in accordance with some embodiments of the present disclosure. FIGS. 17-32 show substantially the same structures as FIGS. 1-16, except there is a larger p-type device region 200' than the p-type device region 200 as shown in FIGS. 1-16.

Figure 17:
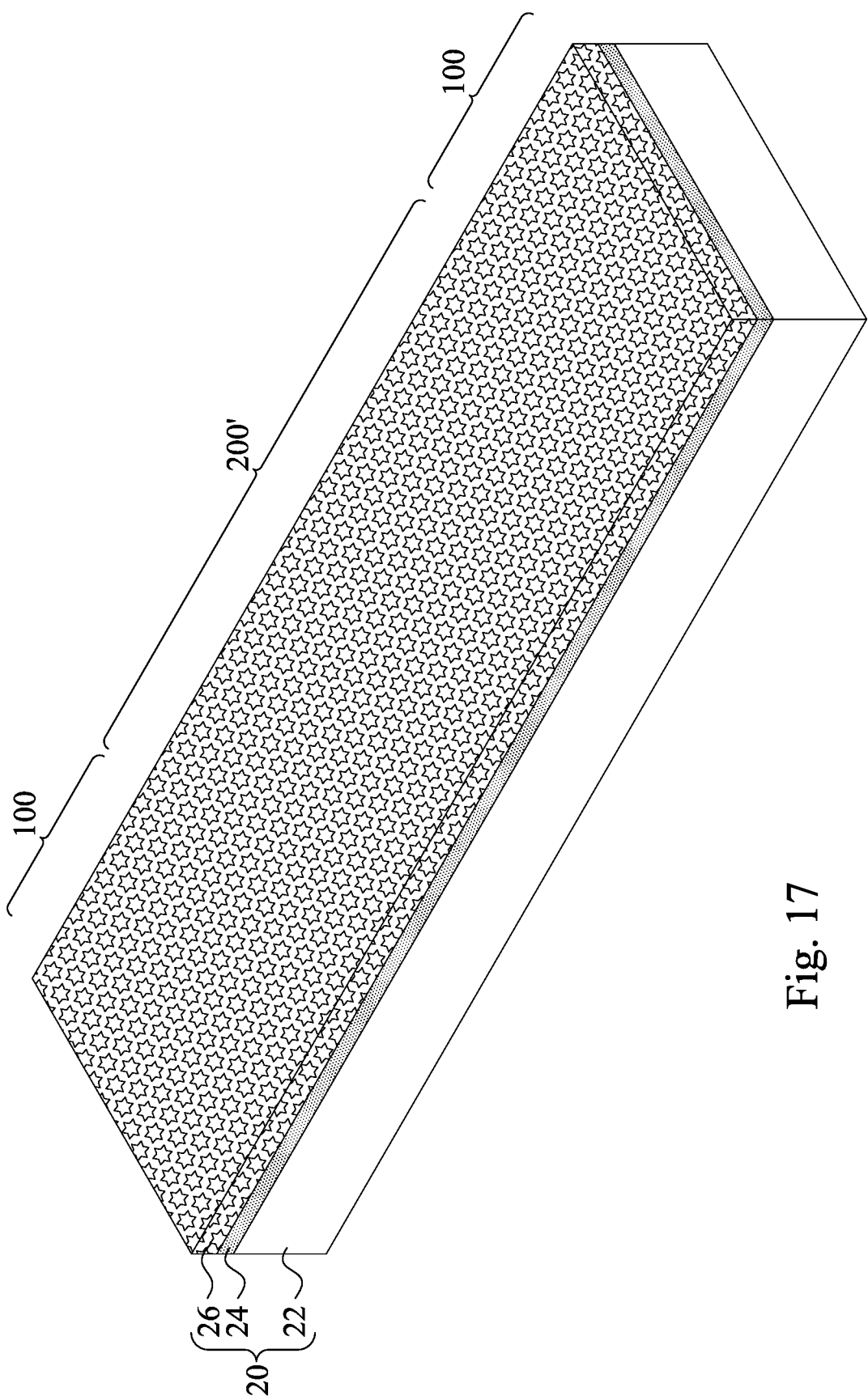

Referring to FIG. 17, a hybrid substrate 20 is provided. The hybrid substrate 20 includes p-type well regions 100 and an n-type well region 200' between the p-type well regions 100. The p-type well regions 100 and the n-type well region 200' are formed, for example, through implantations. The n-type well region 200' has a width greater than that of the n-type well region 200 as shown in FIG. 1. The p-type well regions 100 can be equivalently referred to as n-type device regions, and the n-type well region 200' can be equivalently referred to as a p-type device region in some embodiments. The hybrid substrate 20 includes a crystalline silicon layer 22, a dielectric layer 24 over the silicon layer 22, and a crystalline silicon layer 26 over dielectric layer 24. The silicon layer 22, the dielectric layer 24 and the silicon layer 26 are discussed previously with respect to FIG. 1, and detailed description thereof is thus not repeated for the sake of brevity.

Figure 18:
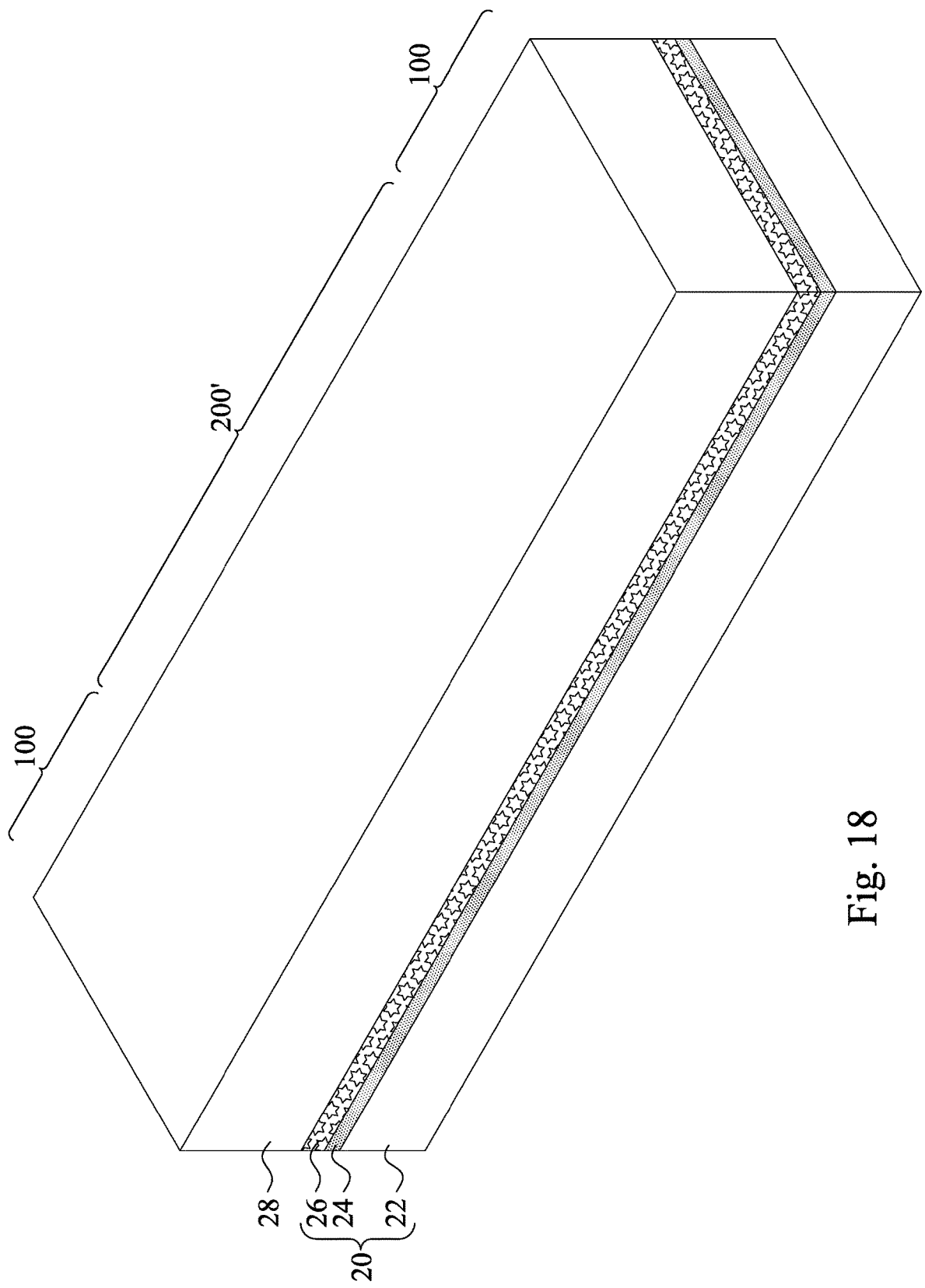

Referring to FIG. 18, an epitaxy is performed to grow silicon layer 28 on silicon layer 26. Epitaxy growth of the silicon layer 28 is discussed previously with respect to FIG. 2, and the detailed description thereof is thus not repeated for the sake of brevity.

Figure 19:
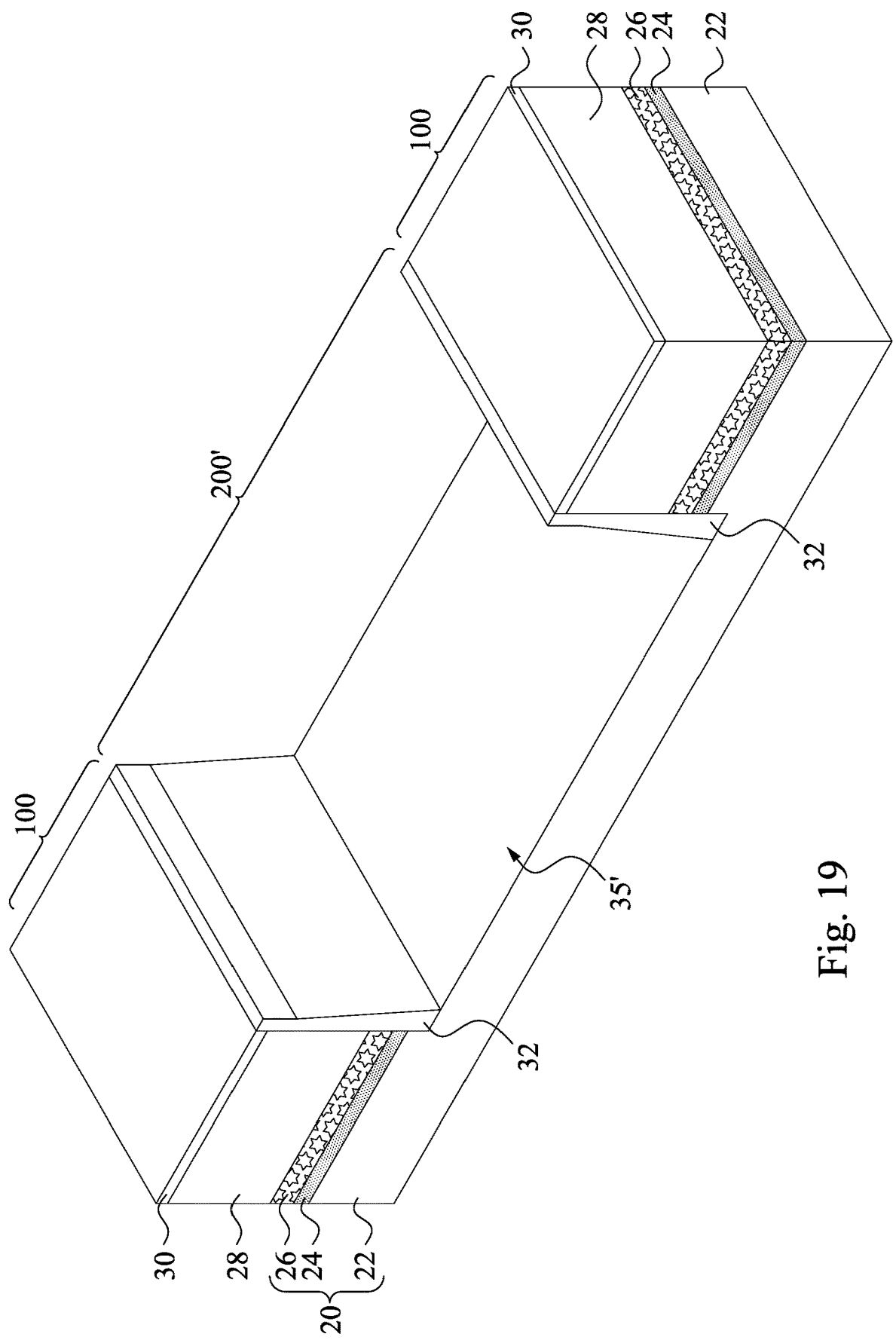

FIG. 19 illustrates the recessing of silicon layer 28 and hybrid substrate 20 in the p-type device region 200', and the recessing is not performed in the n-type device regions 100. Recess 35' is thus formed in the p-type device region 200'. The recess 35' has a width greater than a width of the recess 35 as shown in FIG. 3 because of the larger p-type device region 200'. Formation of the recess 35' is discussed previously with respect to formation of the recess 35 as shown in FIG. 3, and the detailed description therefor is thus not repeated for the sake of brevity.

Next, a spacer layer is deposited, followed by an anisotropic etch to remove the horizontal portions of the spacer layer, so that a spacer 32 is formed. Formation of the spacer 32 is discussed previously with respect to FIG. 3, and the detailed description thereof is thus not repeated for the sake of brevity.

Figure 20A:
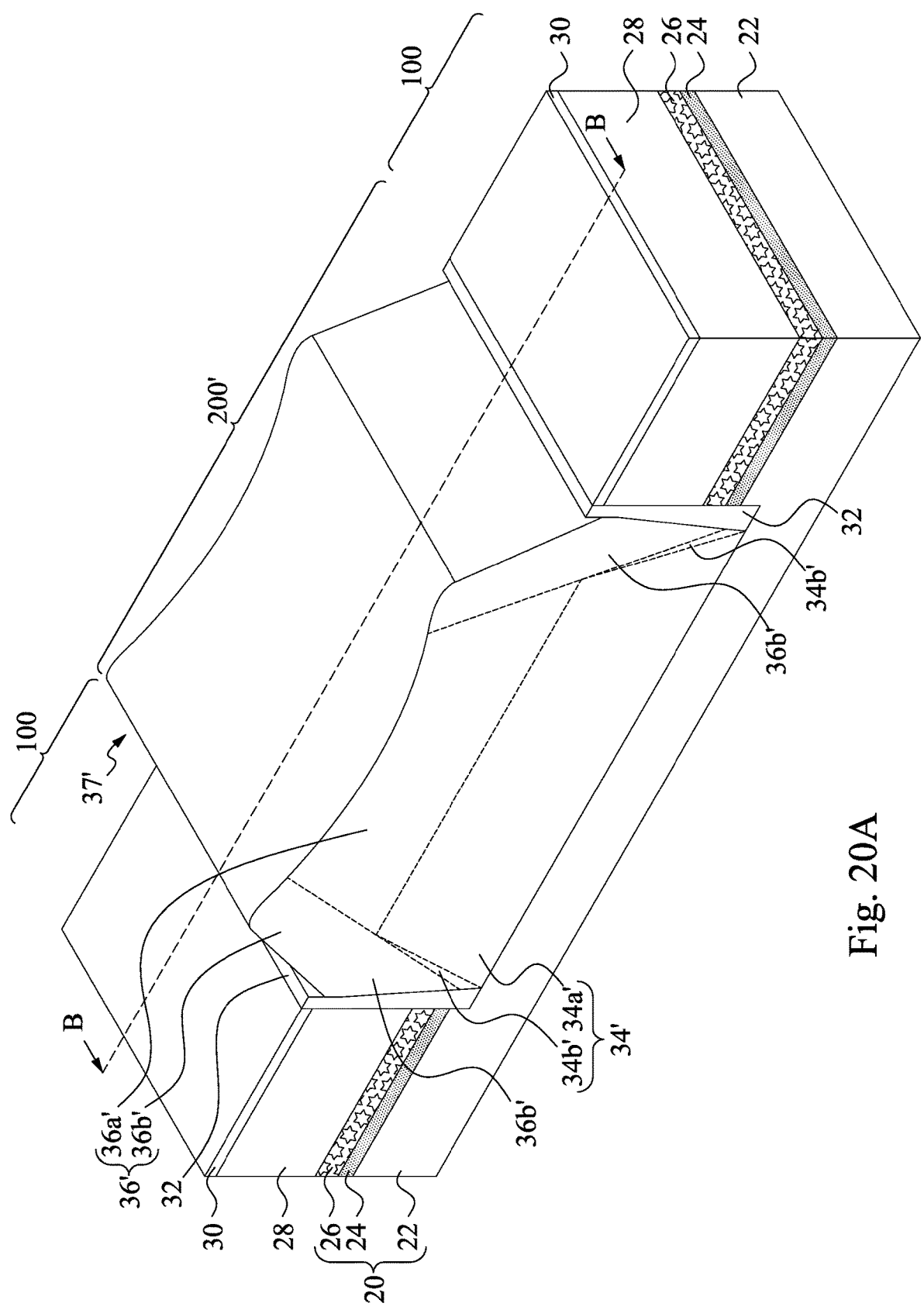
Figure 20B:
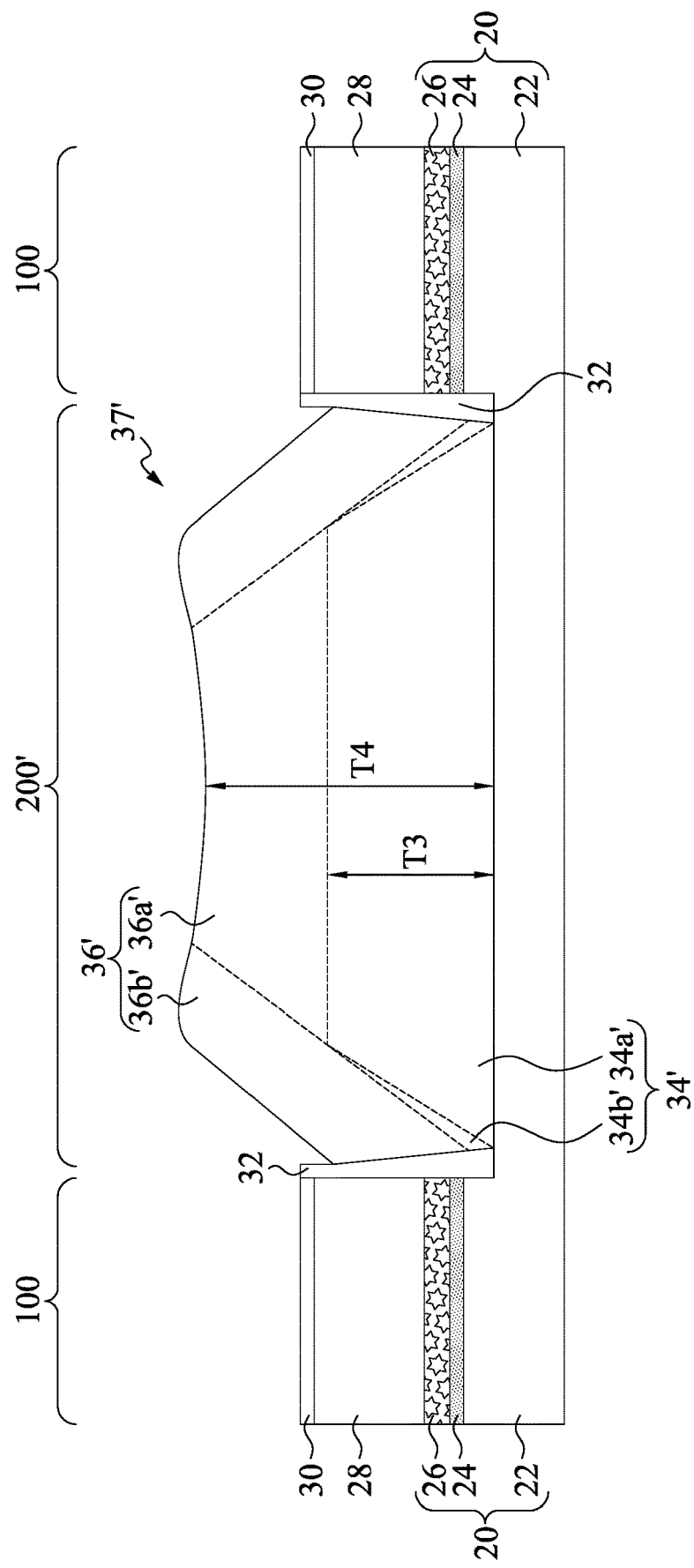

After the spacer 32 is formed, a first epitaxy process and a second epitaxy process are performed to form first and second epitaxy layers 34' and 36', respectively, and the resulting structure is shown in FIGS. 20A and 20B. FIG. 20A illustrates a perspective view of the structure, and FIG. 20B illustrates a cross-sectional view along line B-B in FIG. 20A. Epitaxy growth of the first epitaxy layer 34' is substantially the same as epitaxy growth of the first epitaxy layer 34 as shown in FIGS. 4A and 4B, except that the first portion 34a' of the first epitaxy layer 34 has larger (100) surface than the first portion 34a of the first epitaxy layer 34. This is because the first epitaxy layer 34' is grown on a larger p-type device region 200'. Epitaxy growth of the second epitaxy layer 36' is substantially the same as epitaxy growth of the second epitaxy layer 36 as shown in FIGS. 4A and 4B, except that the first portion 36a' of the second epitaxy layer 36 is larger than the first portion 36a of the second epitaxy layer 36. This is because the second epitaxy layer 36' is grown on a larger top surface of the first portion 34a' that extends along the (100) plane. Similar to the first and second epitaxy layers 34 and 36, the first epitaxy layer 34' includes a second portion 34b' grown on a sidewall of the first portion 34a' that extends along the (111) plane and having a greater germanium concentration than that of the first portion 34a', and the second epitaxy layer 36' includes a second portion 36b' grown on a surface of the second portion 34b' of the first epitaxy layer 34' that extends along the (111) plane and having a greater germanium concentration than that of the first portion 36a'.

In some embodiments, the germanium concentration of the second portion 34b' and the germanium concentration of the first portion 34a' have a difference greater than about 5%. For example, the germanium concentration of the first portion 34a' is in a range from about 20% to about 35%, and the germanium concentration of the second portion 34b' is in a range from about 25% to about 40%. If the epitaxy process of the first SiGe layer 34 continues until the recess 35 is filled with the second portion 34b, the resulting fins (See FIG. 23) would include a large region (i.e., large second portion 34b') having unwantedly increased germanium concentration and a small region (i.e., small first portion 34a' compared to the large second portion 34b') having the desired germanium concentration. For example, a volume percentage of the portion having unwantedly increased germanium concentration in the resulting fin might be from a range about 31% to about 37%, which in turn aggravates non-uniformity of germanium concentration in the resulting fins.

As a result, epitaxy growth of the first SiGe layer 34' stops as long as the epitaxy growth on the (111) plane occurs. Afterwards, process conditions for the SiGe epitaxy process are changed to epitaxially grow the second SiGe layer 36' on the first SiGe layer 34'. Less germanium is introduced in the formation of the second SiGe layer 36' than in the formation of the first SiGe layer 34. In this way, the resulting second SiGe layer 36' has a lower germanium atomic percentage than the second portion 34b' of the first SiGe layer 34'. As a result, the non-uniformity of the germanium concentration in the resulting fins is mitigated in spite of the unwantedly high germanium concentration occurs in the second portion 34b' of the first SiGe layer 34'. For example, a volume percentage of the portion having unwantedly increased germanium concentration (i.e., second portion 34b' of the first SiGe layer 34') in the resulting fin might be from a range about 4% to about 8%, which in turn significantly reduce non-uniformity of germanium concentration in the resulting fins. For example, the germanium concentration of the first portion 36a' of the second SiGe layer 36' is in range from about 15% to about 30%, and the germanium concentration of the second portion 36b' of the second SiGe layer 36' is in a range from about 20% to about 35%.

Formation of the second SiGe layer 36' may be performed in-situ with the formation of the first SiGe layer 34'. In some exemplary embodiments, the partial pressures, hence flow rates of the germanium-containing gases such as $GeH_4$ are reduced to reduce the germanium concentration in the second SiGe layer 36'. In some embodiments, the $GeH_4$ partial pressure difference between growing the first SiGe layer 34' and growing the second SiGe layer 36' is in a range from about 30 mtorr to about 150 mtorr. If the $GeH_4$ partial pressure difference between growing the first SiGe layer 34' and growing the second SiGe layer 36' is greater than about 150 mtorr, the germanium concentration difference between the second portion 36b' of the second SiGe layer 36' and the first portion 34a' of the first SiGe layer 34' might be unsatisfactory for improving the germanium concentration uniformity in the resulting fins. If the $GeH_4$ partial pressure difference between growing the first SiGe layer 34' and growing the second SiGe layer 36' is less than about 30 mtorr, the germanium concentration difference between the second portion 36b' of the second SiGe layer 36' and the first portion 34a' of the first SiGe layer 34' might be unsatisfactory for improving the germanium concentration uniformity in the resulting fins. In some embodiments, the first and second epitaxy layers 34' and 36' are in combination referred to as an multi-layer epitaxy structure 37'.

Moreover, misfit dislocations might occur at the interface between the silicon layer 22 and the SiGe structure 37', if the thickness of the SiGe structure 37' is greater than a critical thickness. However, the critical thickness associated with the misfit dislocations is in positive correlation of the average germanium percentage in the SiGe structure 37'. Because the SiGe structure 37' includes reduced average germanium concentration as discussed above, the critical thickness of the SiGe structure 37' can be increased, which in turn will result in reduced misfit dislocations. In some embodiments, the first SiGe layer 34' has a thickness T3 in a range from about 50 nm to about 70 nm. If the thickness T3 of the first SiGe layer 34' is greater than about 70 nm, misfit dislocations might be increased. In some embodiments, the second SiGe layer 36' has a thickness T4 in a range from about 60 nm to about 80 nm. If the thickness T4 of the second SiGe layer 36' is greater than about 80 nm, misfit dislocations might be increased.

Figure 21A:
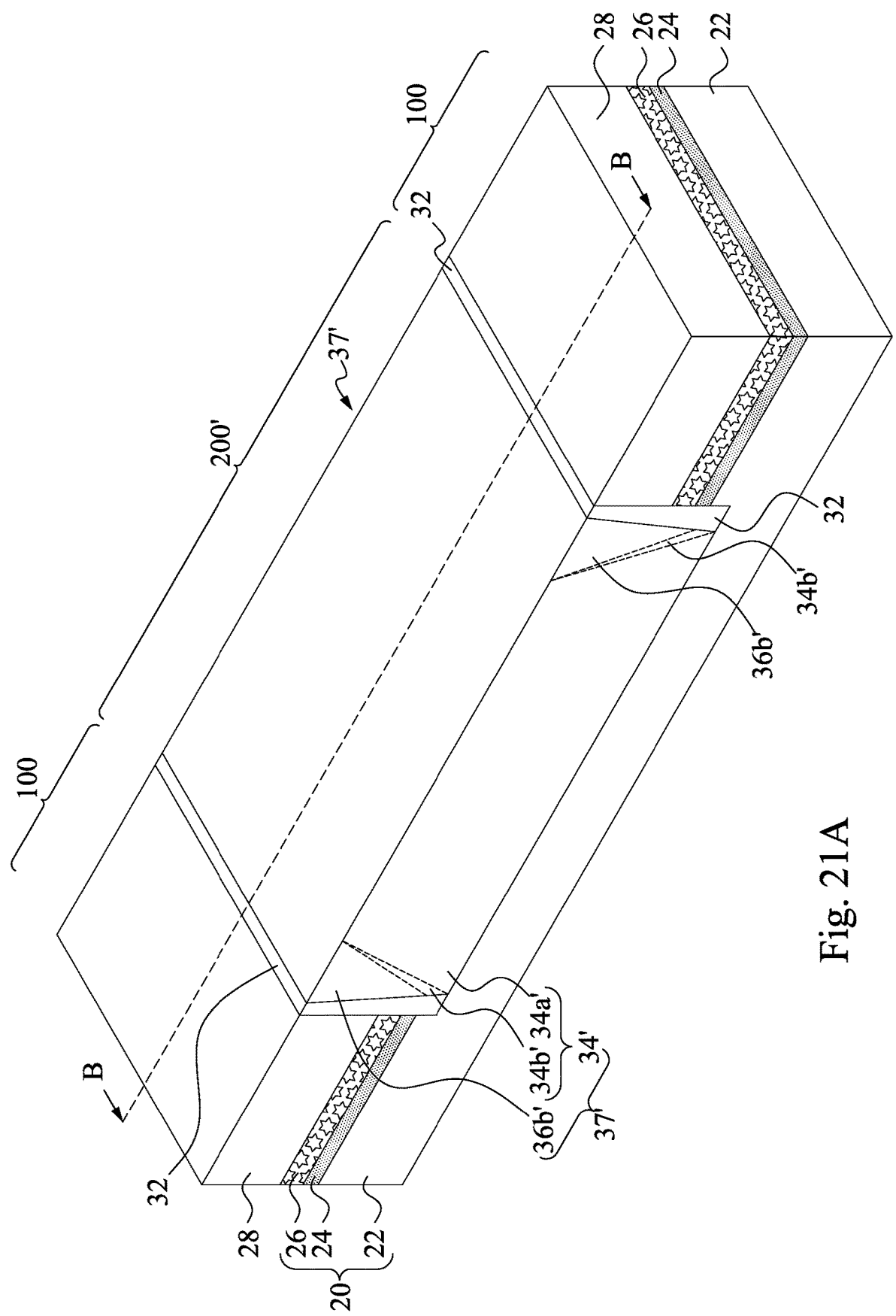
Figure 21B:
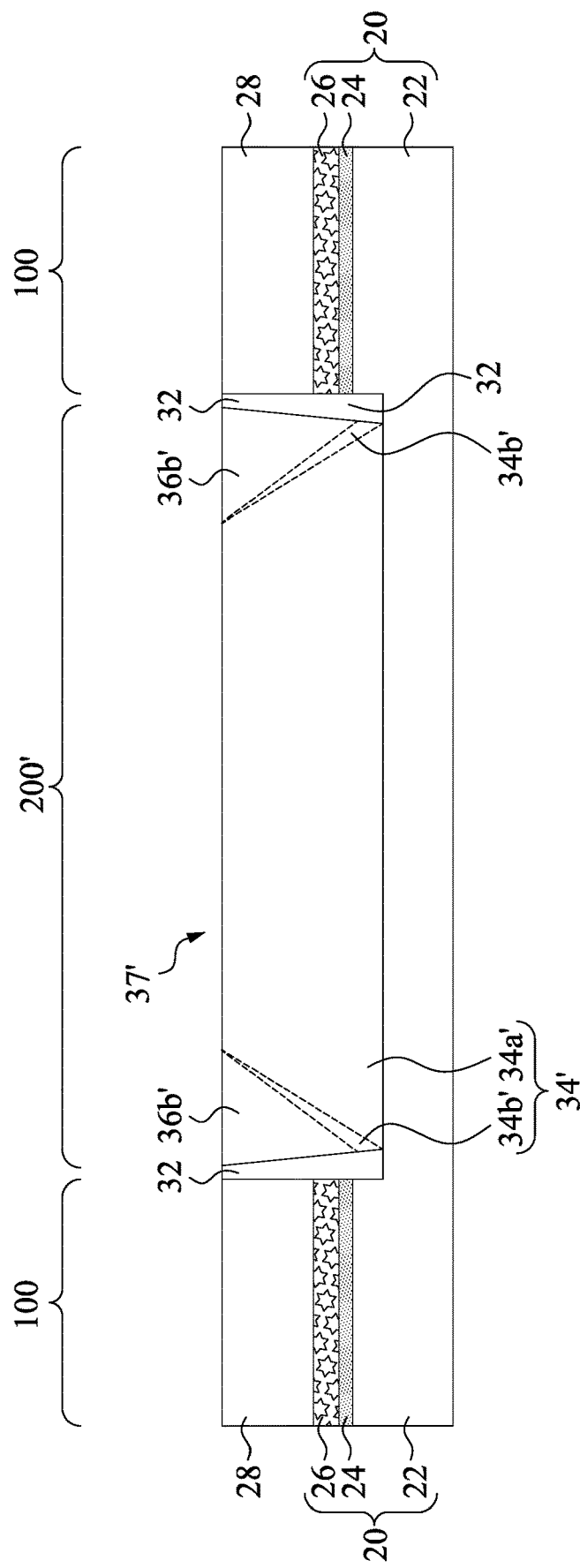

After the epitaxy of epitaxy layers 34' and 36', a planarization step such as Chemical Mechanical Polish (CMP) or mechanical grinding is performed to level the top surface of the structure 37, as shown in FIGS. 21A and 21B. FIG. 21A illustrates a perspective view of the structure, and FIG. 21B illustrates a cross-sectional view along line B-B as shown in FIG. 21A. The planarization is discussed previously with respect to FIGS. 5A and 5B, and the detailed description regarding the planarization is thus not repeated for the sake of brevity.

Figure 22:
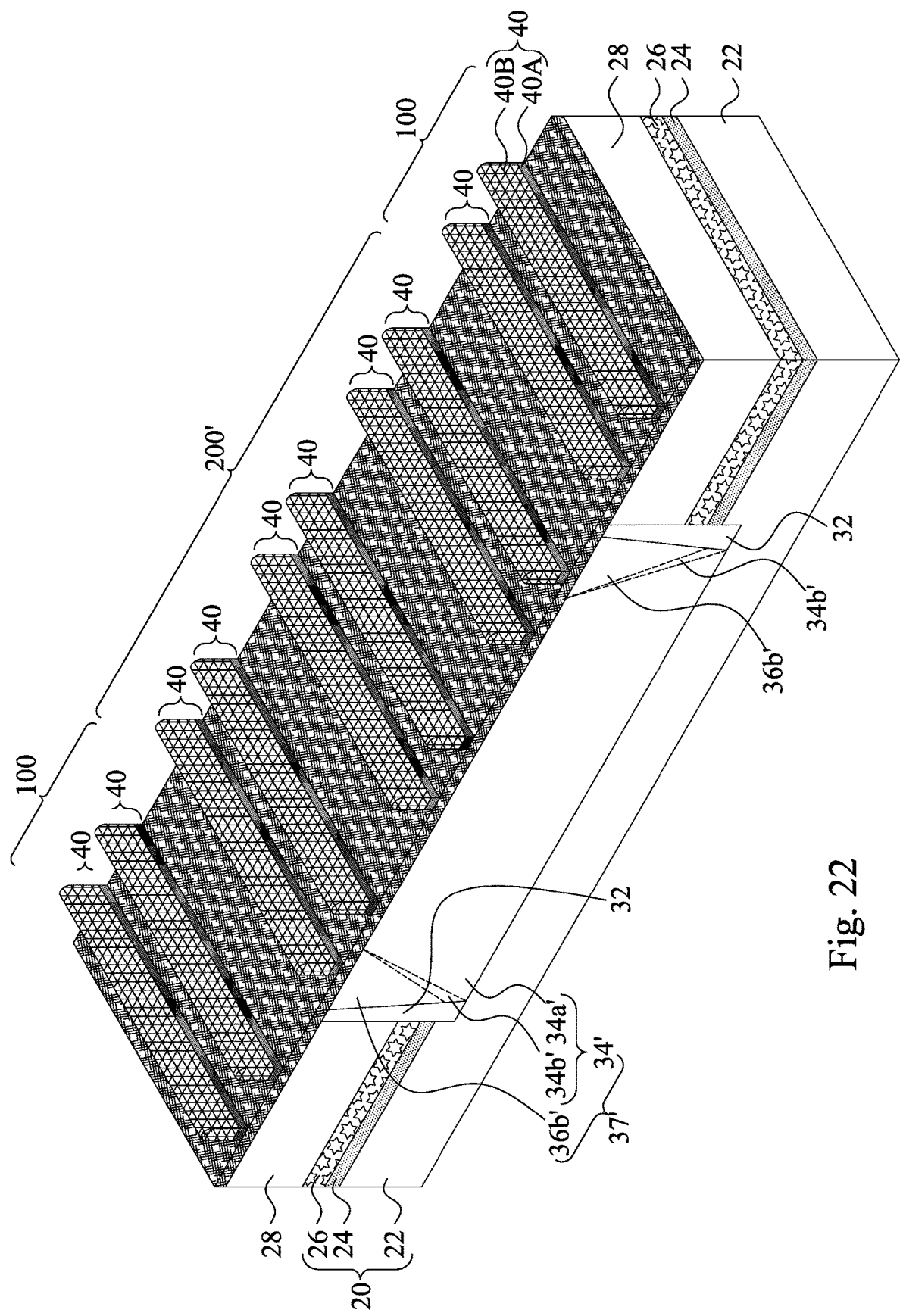

Referring to FIG. 22, a protection layer 38 is formed. In accordance with some embodiments of the present disclosure, the protection layer 38 is formed of silicon, and is deposited on the top surface the structure shown in FIG. 21A. The protection layer 38 is also free from germanium. The deposition may be achieved through an epitaxy process, so that the silicon layer is a crystalline layer.

Figure 23:
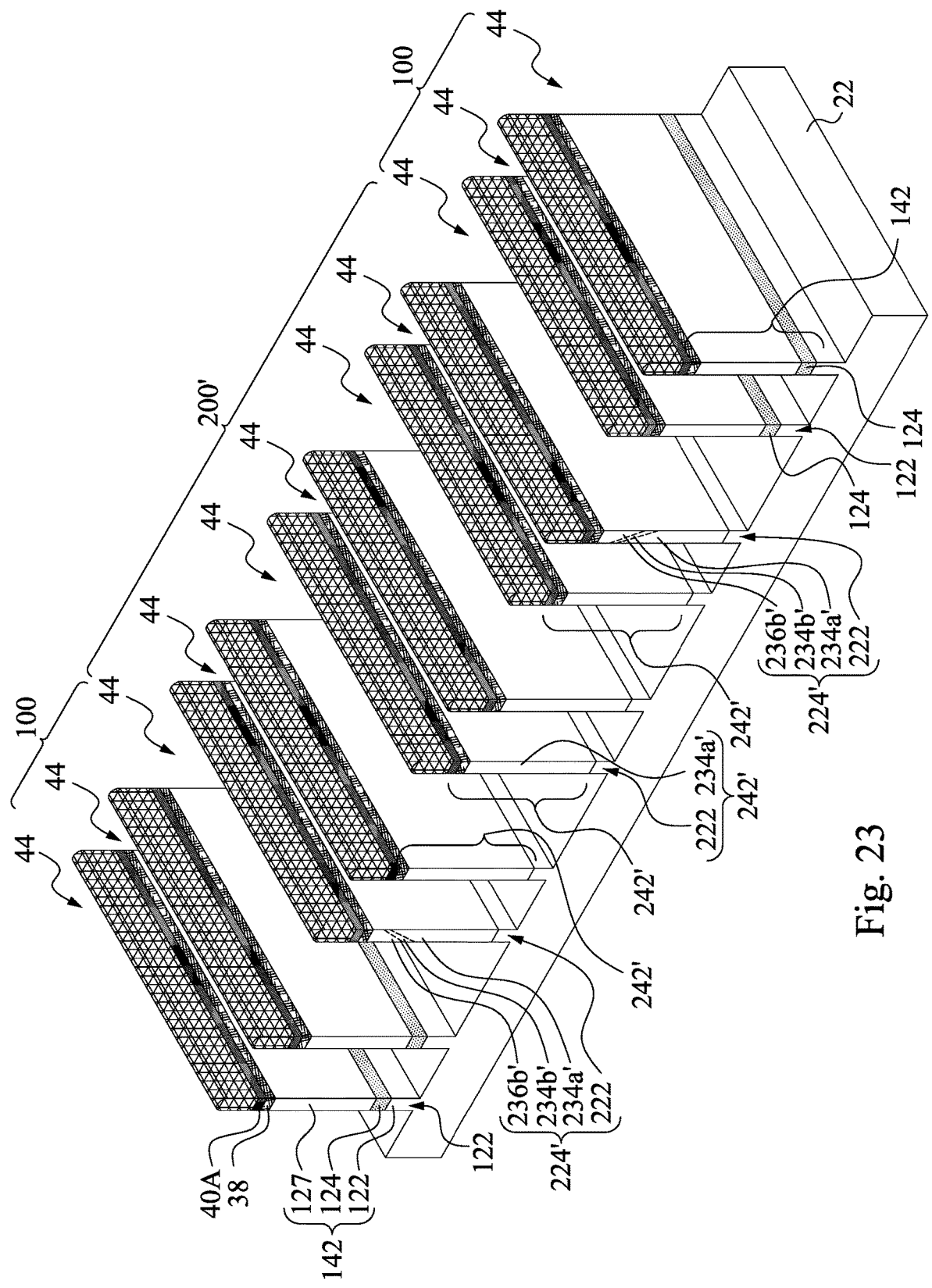

The following steps as shown in FIGS. 22 and 23 illustrate the formation of semiconductor strips. The strips may be patterned by any suitable method, as discussed previously with respect to FIGS. 6 and 7. In accordance with some exemplary embodiments as shown in FIG. 22, mask layer(s) are deposited over the protection layer 38, and are then patterned to form masks 40, which are used as etching mask for forming semiconductor strips. In accordance with some embodiments of the present disclosure, masks 40 include a plurality of layers formed of different materials. For example, masks 40 may include layers 40A formed of silicon oxide, and layers 40B over the respective layers 40A, with layers 40B formed of silicon nitride.

FIG. 23 illustrates a perspective view of the structure after the strip formation. Referring to FIG. 23, an etching process is performed to etch the substrate and epitaxy layers, so that strips 142 are formed in n-type device regions 100, and strips 242' and 244' are formed in p-type device region 200, respectively. Recesses 44 are formed to separate strips 142 and 242' and 244'. Strips 142 include portions 122, 124, and 127. Strip portions 122 are the remaining portions of the patterned silicon layer 22. Strip portions 124 are the remaining portions of dielectric layer 24 (FIG. 22). Strip portions 127 are the remaining portions of silicon layers 26 and 28 (FIG. 22). In accordance with some embodiments of the present disclosure, silicon layers 26 and 28 are (100) R45 layers. Accordingly, both the top surface and sidewalls of strips 142 have (100) surface orientations. Strips 242 include portions 222 and 234a'. Strip portions 222 are the remaining portions of the patterned silicon layer 22. Strip portions 234a' are the remaining portions of first portion 34a' of the first epitaxy layer 34' (FIG. 22). Strips 244' include portions 222, 234a', 234b' and 236'. Strip portions 234b' are remaining portions of the second portion 34b' of the first epitaxy layer 34' (FIG. 22). Strip portions 236b' are remaining portions of the second portion 36b' of the second epitaxy layer 36' (FIG. 22). Strip portions 234a' and 236b' are SiGe portions and have substantially the same germanium concentration. Strip portions 234b' are SiGe portions having higher germanium concentrations than strip portions 234a' and 236b'. In some embodiments, a germanium concentration difference between the strip portions 234a' and 234b' is greater than a germanium concentration difference between the strip portions 234a' and 236b', and a germanium concentration difference between the strip portions 234b' and 236b' is greater than the germanium concentration difference between the strip portions 234a' and 236b' as well.

Figure 24:
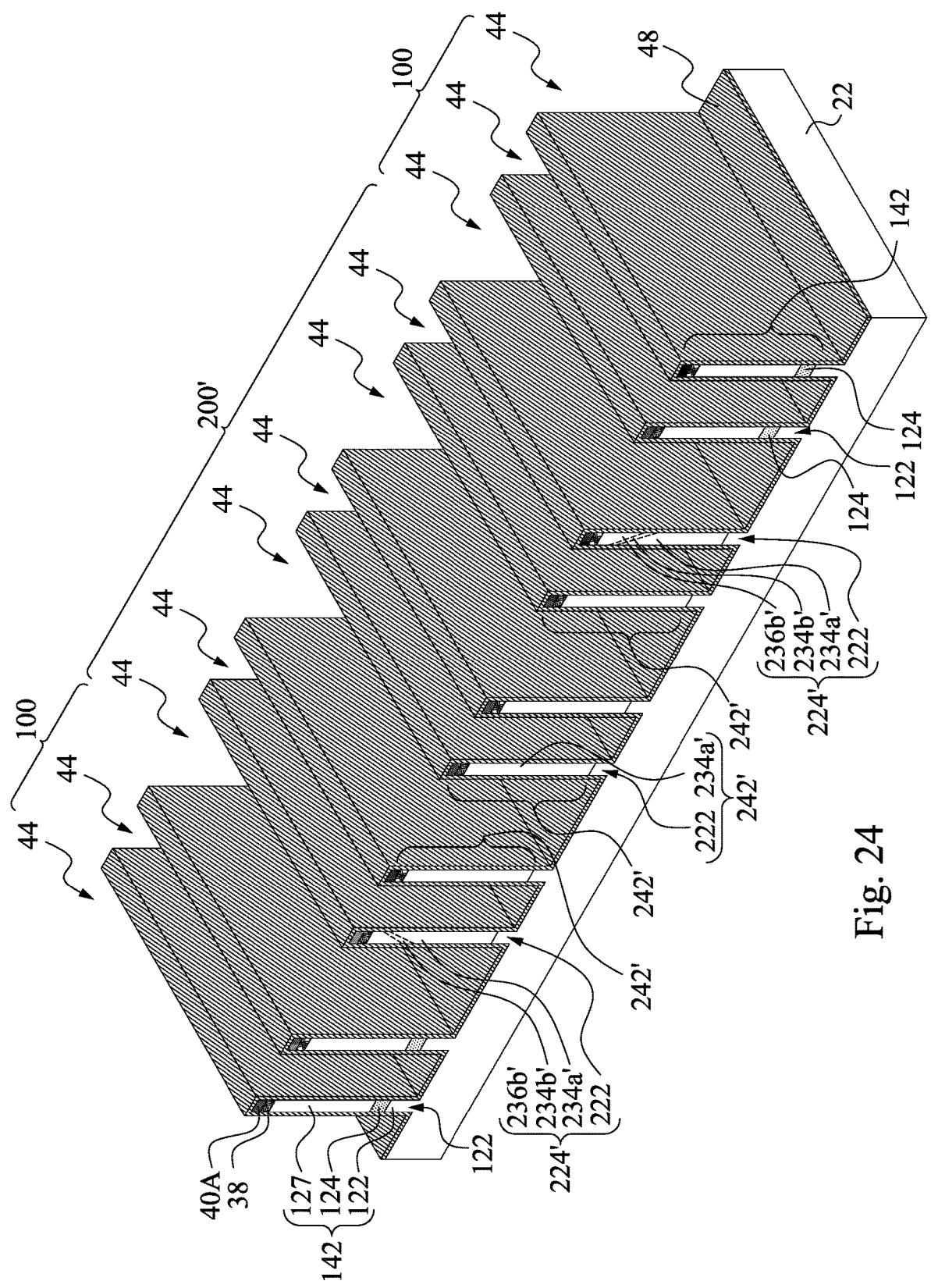

FIG. 24 illustrates the formation of a liner 48, which is used to mask the sidewalls of strip portions 234a', 234b' and 236b' from oxidation. Formation of the liner 48 is discussed previously with respect to FIG. 8, and the detailed description thereof is thus not repeated for the sake of brevity.

Figure 25:
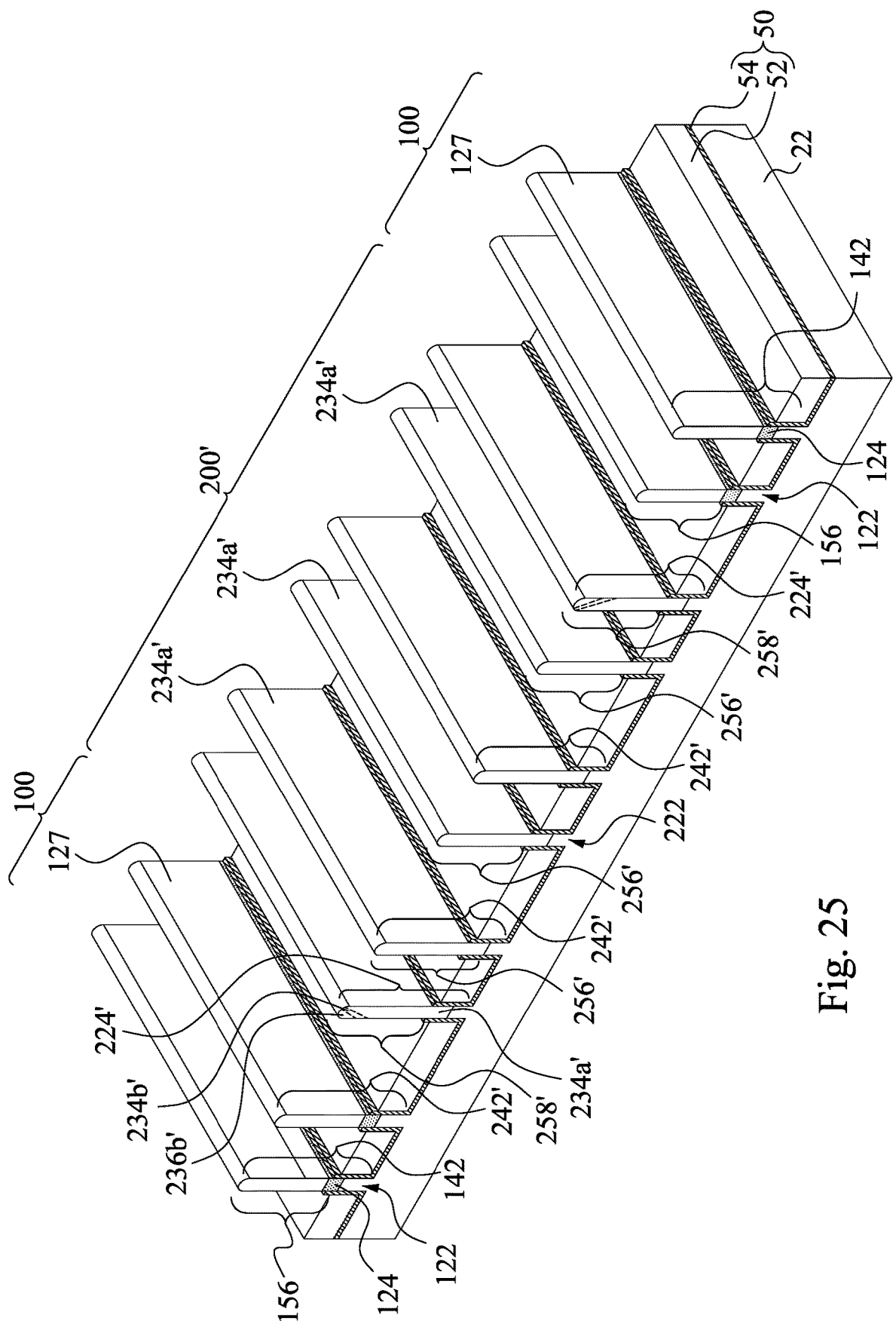

FIG. 25 illustrates the formation of STI regions 50, which includes dielectric liners 52 and dielectric regions 54 over dielectric liners 52. Formation of the STI regions 50 is discussed previously with respect to FIG. 9, and the detailed description thereof is thus not repeated for the sake of brevity.

Next, a planarization such as CMP or mechanical grinding is performed on dielectric regions 54 and dielectric liners 52. The planarization may be performed using masks 40 (FIG. 24) as a stop layer. Next, masks 40 are removed, followed by recessing dielectric regions 54 and dielectric liners 52. The resulting structure is shown in FIG. 25. The remaining portions of dielectric regions 54 and dielectric liners 52 are referred to as STI regions 50. In accordance with some embodiments of the present disclosure, the recessing is performed until the recessed STI regions 50 have their top surfaces lower than the top surfaces of dielectric strip portions 124, so that the sidewalls of dielectric strip portions 124 have at least some portions exposed. In accordance with alternative embodiments of the present disclosure, the recessed STI regions 50 have their top surfaces level with, higher than, or lower than the bottom surfaces of dielectric strip portions 124. Throughout the description, the portions of strips 142, 242' and 244' higher than the top surfaces of STI regions 50 are referred to as fins (or protruding fins) 156, 256' and 258'. The fin 156 has a top end in a position higher than a top end of an interface between the strip portion 234b' and the strip portion 236b'. An interface between the strip portion 124 and the strip portion 127 is in a position lower than a bottom end of the interface between the strip portion 234b' and the strip portion 236b'.

Figure 26:
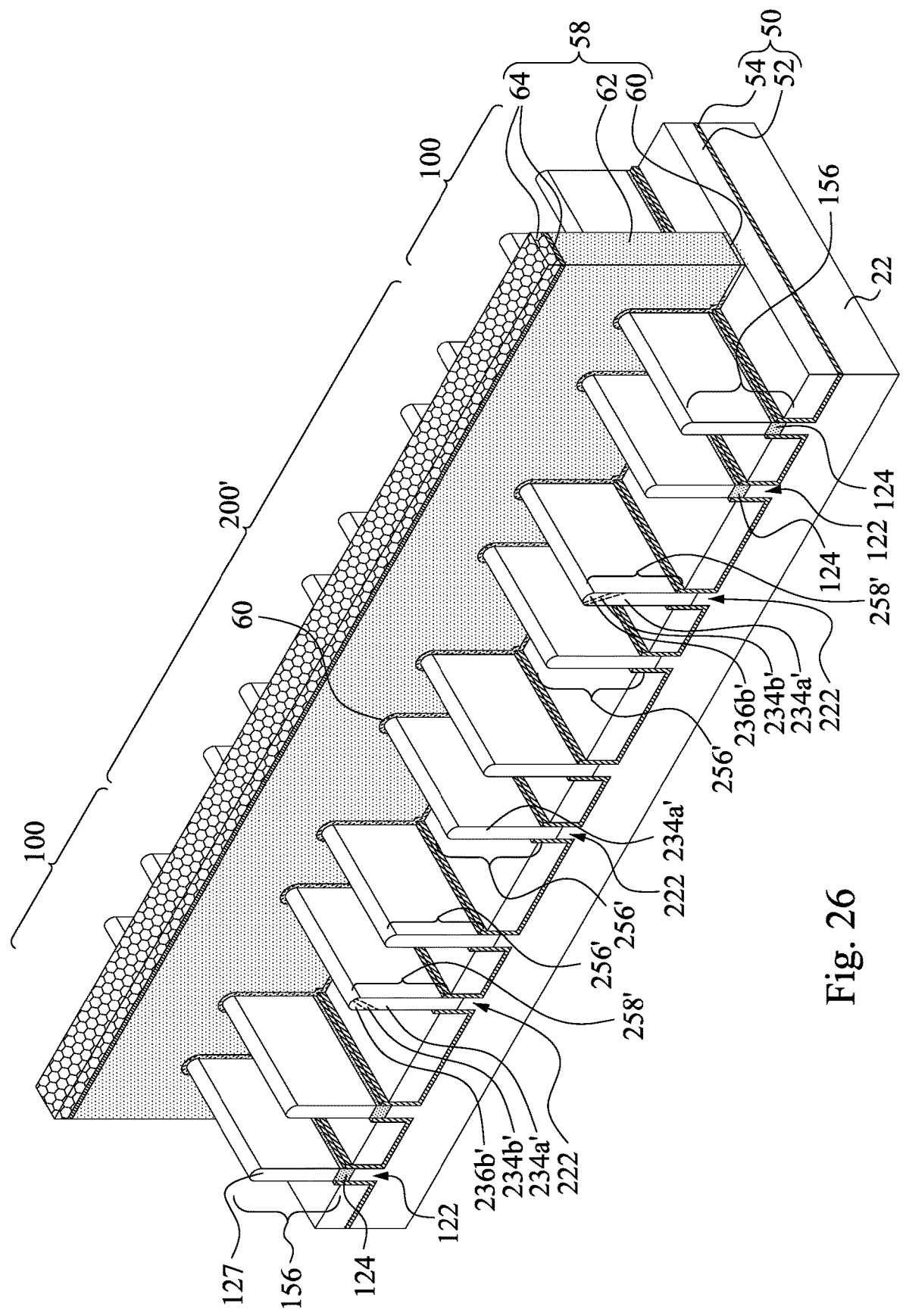

Referring to FIG. 26, a dummy gate stack 58 is formed on the top surfaces and the sidewalls of (protruding) fins 156', 256' and 258'. Formation of the dummy gate stack 58 is discussed previously with respect to FIG. 10, and the detailed description thereof is thus not repeated for the sake of brevity.

Figure 27:
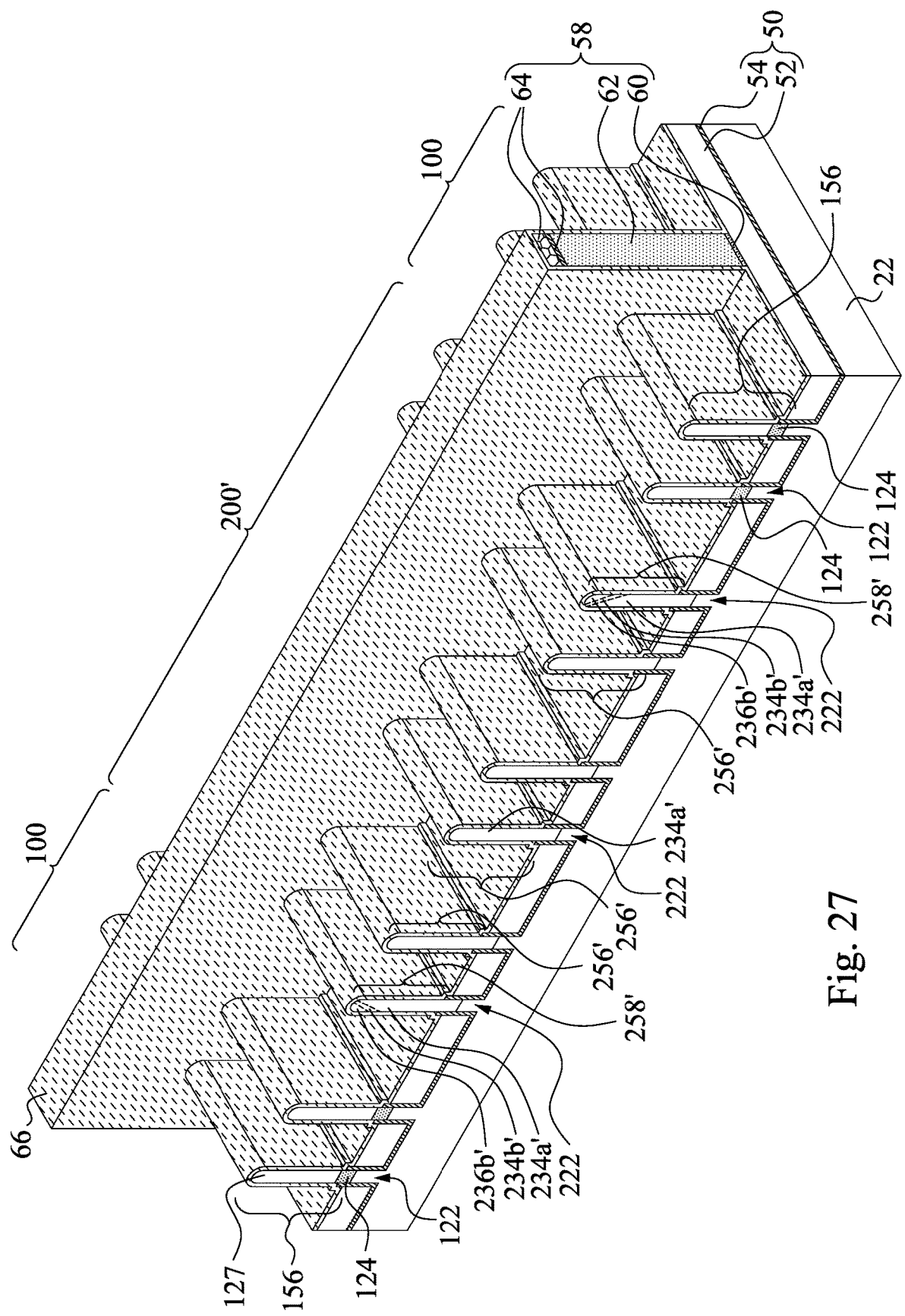

Next, referring to FIG. 27, a spacer layer 66 is deposited. In accordance with some embodiments of the present disclosure, the spacer layer 66 is formed of a dielectric material such as silicon nitride, silicon carbon-oxyitride (SiCN), or the like, and may have a single-layer structure or a multi-layer structure including a plurality of dielectric layers. The formation may be performed through a conformal deposition method such as ALD or CVD.

Figure 28:
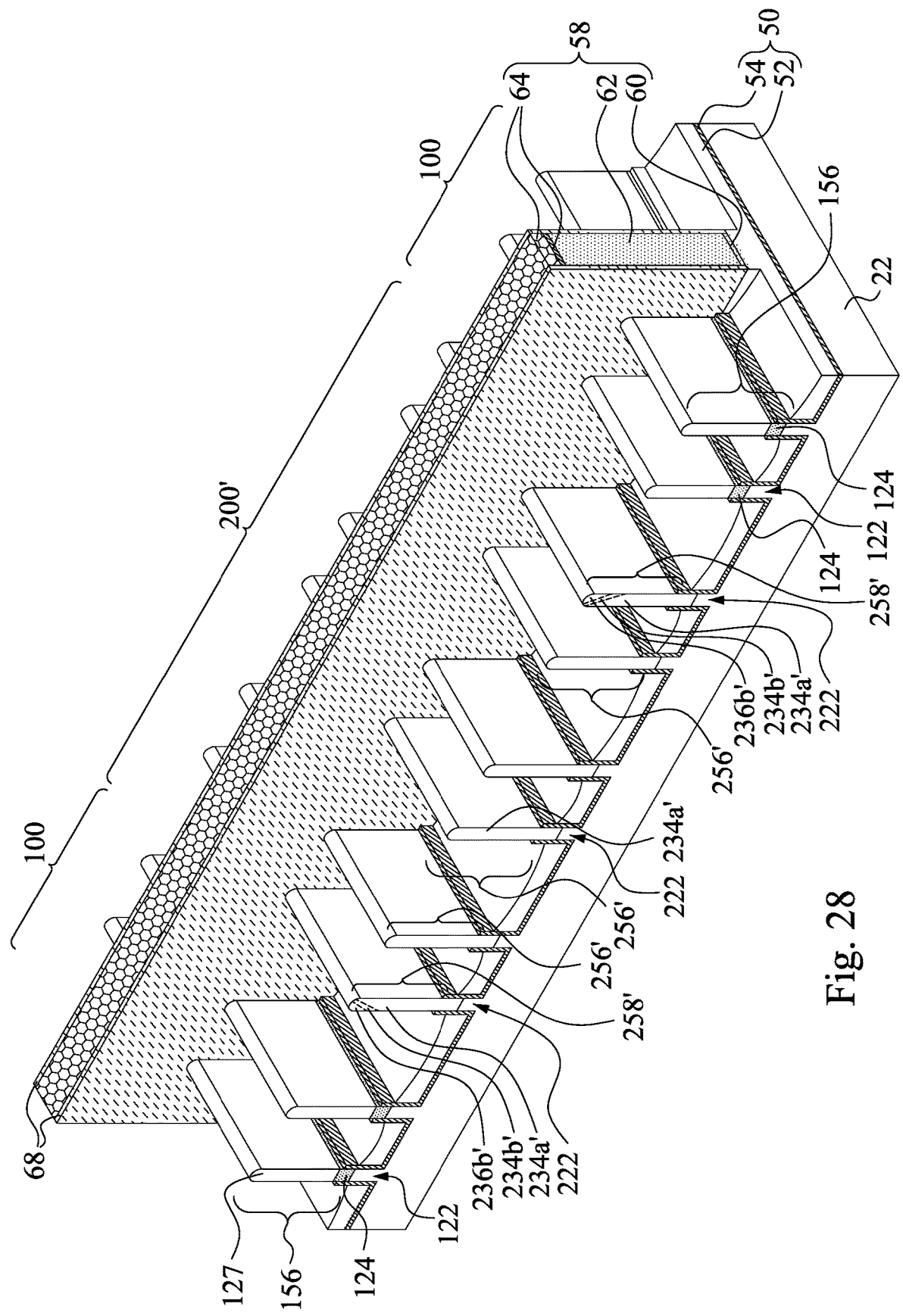

FIG. 28 illustrates the etching of the spacer layer 66, resulting in the formation of gate spacers 68 on the sidewalls of the dummy gate stack 58. Etching the spacer layer 66 is discussed previously with respect to FIG. 12, and the detailed description thereof is thus not repeated for the sake of brevity.

Figure 29:
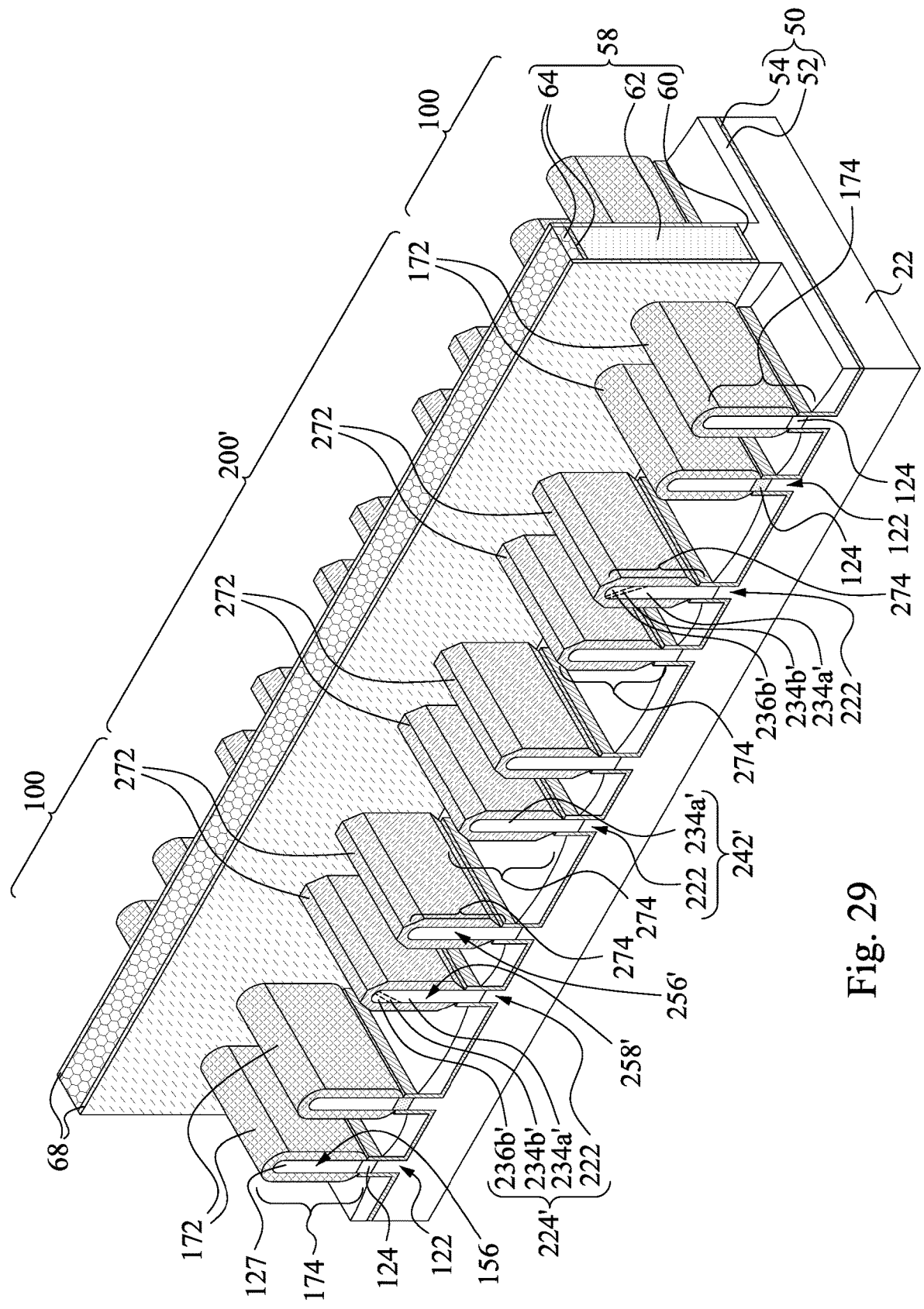

Next, epitaxy regions 172 are formed by selectively growing semiconductor materials on protruding fins 156', and epitaxy regions 272 are formed by selectively growing semiconductor materials on protruding fins 256' and 258', resulting in the structure in FIG. 29. Epitaxial growth of the pitaxy regions 172 and 272 is discussed previously with respect to FIG. 13, and the detailed description thereof is thus not repeated for the sake of brevity.

After the epitaxy step, epitaxy regions 172 and strip portions 127 may be further implanted with an n-type impurity to form source and drain regions 174 for the n-type FinFETs. Epitaxy regions 272 and strip portions 234a' of strips 242' and strip portions 234a', 234b' and 236b' of strips 244' may also be implanted with a p-type impurity to form source and drain regions 274 for the p-type FinFETs. In accordance with alternative embodiments of the present disclosure, the implantation step is skipped when epitaxy regions 172 and 272 are in-situ doped with the p-type or n-type impurity during the epitaxy.

Although FIG. 29 illustrates that source/drain regions 174 are separated from each other, and source/drain regions 274 are separated from each other, it is realized that depending on how long the epitaxy processes last, source/drain regions 174 may be merged with each other or remain separated from each other, and source/drain regions 274 may be merged with each other or remain separated from each other. Also, the shapes of the epitaxy regions 172 and 272 may be similar to what is shown, or have other shapes such as spade/diamond shapes. Air gaps may be formed directly underlying the merged portions of epitaxy regions 172, and/or directly underlying the merged portions of epitaxy regions 272.

Figure 30:
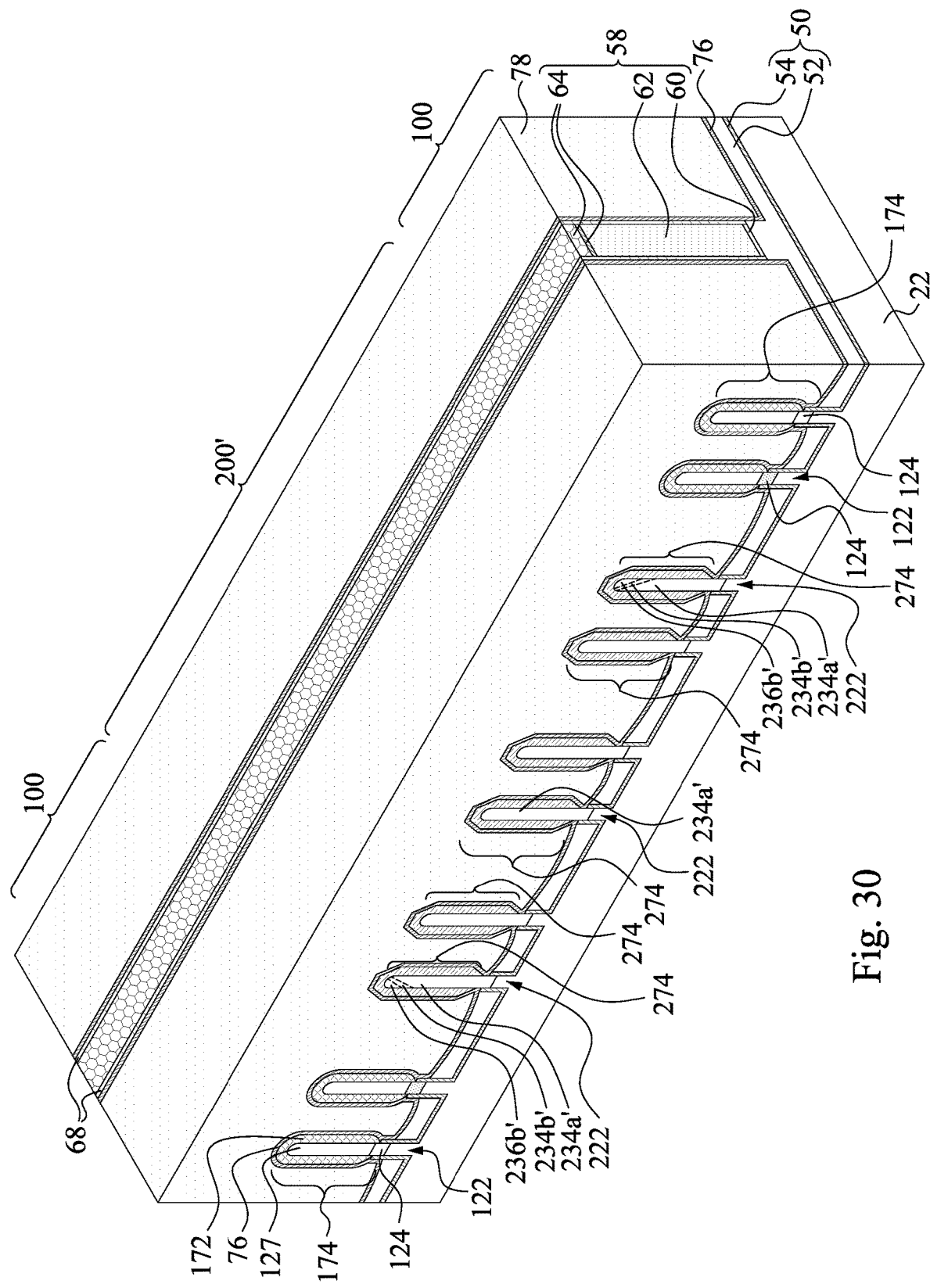

FIG. 30 illustrates a perspective view of the structure with Contact Etch Stop Layer (CESL) 76 and Inter-Layer Dielectric (ILD) 78 being formed. Formation of the CESL 76 and the ILD 78 is discussed previously with respect to FIG. 14, and the detailed description thereof is thus not repeated for the sake of brevity.

Figure 31:
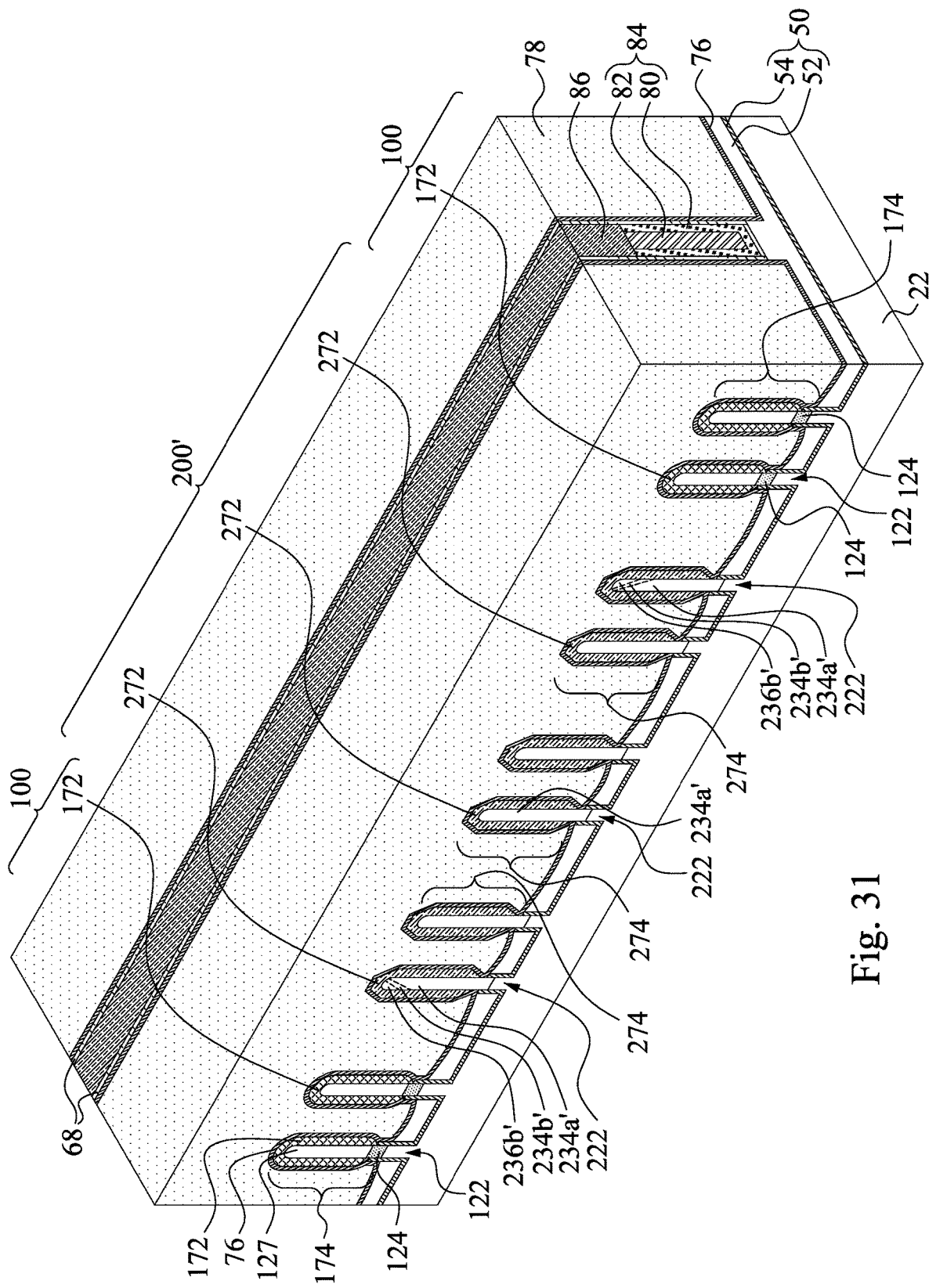

Next, dummy gate stack 58, which include hard mask layer 64, dummy gate electrode 62 and dummy gate dielectric 60, is replaced with replacement gate stack 84, which include metal gates 82 and replacement gate dielectrics 80 as shown in FIG. 31. The process can be referred to as a gate last process or gate replacement process, which is discussed previously with respect to FIG. 25 and is thus not repeated for the sake of brevity. After the formation of the replacement gate stack 84, replacement gate stack 84 is recessed, and dielectric hard mask 86 is filled into the recess.

Figure 32:
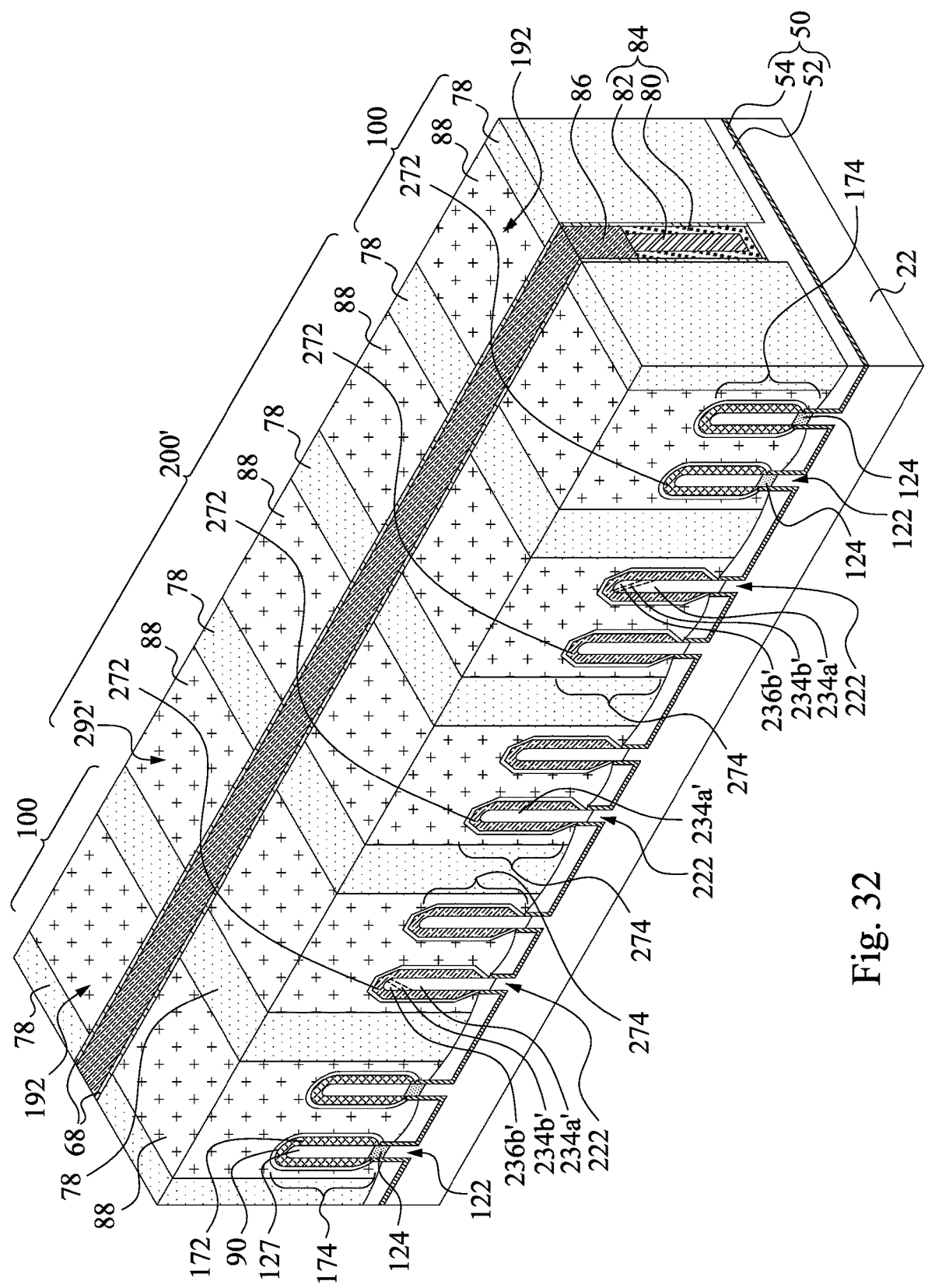

After the structure as shown in FIG. 31 is formed, ILD 78 and CESL 76 are etched to form contact openings. The etching may be performed using, for example, Reactive Ion Etch (RIE). In a subsequent step, as shown in FIG. 32, source/drain contact plugs 88 are formed. Formation of the source/drain contact plugs 88 is discussed previously with respect to FIG. 16, and detailed description thereof is thus not repeated for the sake of brevity. N-type FinFETs 192 and a p-type FinFET 292' are thus formed.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that uniformity of the germanium concentration in the SiGe fin can be improved in spite of a portion of the SiGe fin grown on (111) plane has higher germanium concentration than other portions of the SiGe fin. This is because the later-grown SiGe layer is formed using a germanium-containing gas with a reduced flow rate compared to that of forming the initially-grown SiGe layer. Another advantage is that misfit dislocations can be reduced because the associated critical thickness of the SiGe fin is increased by reduction of the average germanium concentration in the SiGe fin.

In some embodiments, a method includes etching a substrate to form a recess extending into the substrate, performing a first silicon germanium (SiGe) epitaxy process to grow a first portion of a first SiGe layer from a bottom surface of the recess, and to grow a second portion of the first SiGe layer from a (111) facet of the first portion of the first SiGe layer, wherein the second portion of the first SiGe layer has a germanium concentration higher than a germanium concentration of the first portion of the first SiGe layer, performing a second SiGe epitaxy process to grow a first portion of a second SiGe layer from a top surface of the first portion of the first SiGe layer, and to grow a second portion of the second SiGe layer from the second portion of the first SiGe layer, wherein the first portion of the second SiGe layer has a germanium concentration lower than the germanium concentration of the first portion of the first SiGe layer, and patterning the first and second SiGe layers to form a SiGe fin. In some embodiments, performing the second SiGe epitaxy process is performed such that the second portion of the second SiGe layer has a germanium concentration less than a germanium concentration of the second portion of the first SiGe layer. In some embodiments, performing the second SiGe epitaxy process is performed such that the second portion of the second SiGe layer has a germanium concentration substantially the same as the germanium concentration of the first portion of the first SiGe layer. In some embodiments, performing the second SiGe epitaxy process is performed such that the second portion of the second SiGe layer has a germanium concentration higher than the germanium concentration of the first portion of the second SiGe layer. In some embodiments, the method further includes prior to patterning the first and second SiGe layers, performing a chemical mechanical polish (CMP) process on the first and second SiGe layers, such that the first portion of the second SiGe layer is removed to expose the first portion of the first SiGe layer. In some embodiments, the method further includes prior to patterning the first and second SiGe layers, the second portion of the second SiGe layer remains on the second portion of the first SiGe layer after the CMP process is completed. In some embodiments, patterning the first and second SiGe layers results in that the SiGe fin has a remainder of the first portion of the first SiGe layer and a remainder of the second portion of the first SiGe layer forming a first interface with the remainder of the first portion of the first SiGe layer, wherein the first interface extends at a first tilt angle from a first sidewall of the SiGe fin to a second sidewall of the SiGe fin. In some embodiments, patterning the first and second SiGe layers results in that the SiGe fin has a remainder of the second portion of the second SiGe layer forming a second interface with a remainder of the second portion of the first SiGe layer, wherein the second interface extends at a second tilt angle from the first sidewall of the SiGe fin to the second sidewall of the SiGe fin. In some embodiments, the first tilt angle is steeper than the second tilt angle. In some embodiments, the remainder of the second portion of the first SiGe layer in the SiGe fin has a thickness decreasing as it extends from the first sidewall of the SiGe fin to the second sidewall of the SiGe fin.

In some embodiments, a method includes etching a p-type field effect transistor (PFET) region of a substrate to form a recess between n-type field effect transistor (NFET) regions, forming spacers lining sidewalls of the recess, after forming the spacers, performing a multistep epitaxy process to form a SiGe structure from a bottom surface of the recess and after the multistep epitaxy process is completed, etching the SiGe structure to form a SiGe fin. The multistep epitaxy process includes performing a first epitaxy step by using a germanium-containing gas to form a first SiGe layer in the recess until epitaxy growth on (111) plane occurs, after the epitaxy growth on the (111) plane occurs, reducing a flow rate of the germanium-containing gas and after the flow rate of the germanium-containing gas is reduced, performing a second epitaxy step to form a second SiGe layer that fills a remainder of the recess. In some embodiments, the method further includes before etching the SiGe structure to form the SiGe fin, planarizing the SiGe structure such that top surfaces of the spacers and a top surface of the SiGe structure are coplanar. In some embodiments, the method further includes after forming the SiGe fin, forming a silicon liner lining sidewalls of the SiGe fin, and oxidizing the silicon liner into a silicon oxide liner. In some embodiments, the method further includes forming a shallow trench isolation (STI) region laterally surrounding a lower portion of the SiGe fin after oxidizing the silicon liner into the silicon oxide liner. In some embodiments, the multistep epitaxy process results in the SiGe structure having a lower SiGe portion, an intermediate SiGe portion over the lower SiGe portion and an upper SiGe portion over the intermediate SiGe portion, and the intermediate SiGe portion has a higher germanium concentration than both the lower and upper SiGe portions. In some embodiments, the lower and upper SiGe portions have a comparable germanium concentration. In some embodiments, the intermediate SiGe portion extends along a tilting direction from a first sidewall of the SiGe fin to a second sidewall of the SiGe fin.

In some embodiments, the method includes forming a silicon layer over a hybrid substrate, wherein the hybrid substrate comprises a first semiconductor layer having a first surface orientation, a dielectric layer over the first semiconductor layer, and a second semiconductor layer over the first semiconductor layer and having a second surface orientation different from the first surface orientation, forming a capping layer covering an n-type field effect transistor (NFET) region of the hybrid substrate but not covering a p-type field effect transistor (PFET) region of the hybrid substrate, etching the PFET region to form a recess extending through the silicon layer, the second semiconductor layer, the dielectric layer into the first semiconductor layer, epitaxially growing a multilayer SiGe structure in the recess, the multilayer SiGe structure having a lower layer, an intermediate layer having a higher germanium concentration than the lower layer, and an upper layer having a lower germanium concentration than the intermediate layer, performing a chemical mechanical polish (CMP) process on the multilayer SiGe structure until the silicon layer within the NFET region is exposed, and after performing the CMP process on the multilayer SiGe structure, etching the silicon layer to form an NFET fin, and etching the multilayer SiGe structure to form a PFET fin. In some embodiments, etching the silicon layer is performed such that the dielectric layer on the n-type field effect transistor (NFET) region is etched to form a dielectric strip within the NFET fin. In some embodiments, the PFET fin is free of the dielectric strip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first pedestal extending upwards from a substrate, the first pedestal having source/drain regions and a channel region between the source/drain regions, and the first pedestal having a variation in concentration of germanium, and wherein the first pedestal comprises:
a first portion;
a second portion; and
a third portion interposing the first portion and the second portion vertically, wherein the first portion and the second portion have the variation in concentration of germanium being greater than 5%, and the second portion has a volume percentage in the first pedestal in a range from 4% to 8%;
a metal gate stack on the channel region of the first pedestal; and
an epitaxy material surrounding the source/drain regions of the first pedestal.

2. The semiconductor device of claim 1, wherein the second portion and the third portion have the variation in concentration of germanium being greater than 5%.

3. The semiconductor device of claim 2, wherein the first portion has a bottom surface and a top surface inclined with respect to the bottom surface of the first portion.

4. The semiconductor device of claim 2, further comprising:
  a second pedestal extending upwards from the substrate and disposed adjacent to the first pedestal, wherein the second pedestal comprises:
    a first region; and
    a second region over the first region and having a germanium concentration different from a germanium concentration of the first region, and the second region has a top surface inclined with respect to a bottom surface of the first region.

5. The semiconductor device of claim 4, wherein the top surface of the second region of the second pedestal inclines upward in a direction toward the first pedestal.

6. The semiconductor device of claim 4, wherein the second region has a bottom surface inclined with respect to the bottom surface of the first region.

7. The semiconductor device of claim 6, wherein the bottom surface of the second region of the second pedestal inclines upward in a direction toward the first pedestal.

8. The semiconductor device of claim 4, wherein a difference between the germanium concentration of the first region and the germanium concentration of the second region of the second pedestal is greater than 5%.

9. A semiconductor device, comprising:
  a substrate having p-type well regions and an n-type well region between the p-type well regions;
  a first silicon germanium fin on the n-type well region;
  a second silicon germanium fin on the n-type well region and next to the first silicon germanium fin, the first silicon germanium fin having a silicon concentration variation greater than a silicon concentration variation of the second silicon germanium fin; and
  a gate strip over and crossing the first silicon germanium fin and the second silicon germanium fin.

10. The semiconductor device of claim 9, further comprising:
  a third silicon germanium fin on the n-type well region, wherein the second silicon germanium fin is disposed between the first silicon germanium fin and the third silicon germanium fin, and the third silicon germanium fin has a silicon concentration variation substantially the same as the silicon concentration variation of the second silicon germanium fin.

11. The semiconductor device of claim 10, wherein the first silicon germanium fin has a bottommost portion having a silicon concentration substantially same as a silicon concentration of the third silicon germanium fin.

12. The semiconductor device of claim 10, wherein the first silicon germanium fin has a topmost portion having a silicon concentration substantially same as a silicon concentration of the third silicon germanium fin.

13. A semiconductor device, comprising:
  a first multilayer strip extending in a first direction over a substrate, the first multilayer strip having a silicon strip and a silicon germanium strip over the silicon strip, wherein the silicon germanium strip has a first facet at a bottom surface of the silicon germanium strip and a second facet at an intermediate region in the silicon germanium strip, and the first facet is non-parallel with the second facet;
  a gate stack over the first multilayer strip and extending in a second direction perpendicular to the first direction; and
  source/drain features on the first multilayer strip on opposing sides of the gate stack.

14. The semiconductor device of claim 13, wherein the first facet is (100) surface orientation, and the second facet is (111) surface orientation.

15. The semiconductor device of claim 13, wherein the source/drain features surround the silicon germanium strip without surrounding the silicon strip.

16. The semiconductor device of claim 13, wherein the silicon germanium strip has an upper portion over the first facet and a lower portion under the first facet, and the upper portion and the lower portion have different germanium concentrations.

17. The semiconductor device of claim 16, wherein the upper portion of the silicon germanium strip has a germanium concentration higher than a germanium concentration of the lower portion of the silicon germanium strip.

18. The semiconductor device of claim 1, further comprising:
  a plurality of silicon pedestals extending upwards from the substrate and disposed adjacent to the first pedestal; and
  a dielectric material disposed between one of the plurality of silicon pedestals and the substrate.

19. The semiconductor device of claim 18, wherein the dielectric material is silicon oxide.

20. The semiconductor device of claim 18, further comprising:
  an epitaxial structure doped with n-type dopants and surrounding the one of the plurality of silicon pedestals.

* * * * *